(12) United States Patent
McCrate et al.

(10) Patent No.: US 12,405,852 B2
(45) Date of Patent: Sep. 2, 2025

(54) DECODER FOR INTERLEAVED REED-SOLOMON (IRS) WITH ERASURE/COLLABORATIVE

(71) Applicant: Micron Technology, Inc., Boise, ID (US)

(72) Inventors: Joseph M. McCrate, Boise, ID (US); Kirthi Shenoy, Boise, ID (US); Marco Sforzin, Boise, ID (US); Brian M. Twait, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/415,631

(22) Filed: Jan. 17, 2024

(65) Prior Publication Data

US 2024/0378114 A1 Nov. 14, 2024

Related U.S. Application Data

(60) Provisional application No. 63/480,175, filed on Jan. 17, 2023, provisional application No. 63/480,183, filed on Jan. 17, 2023.

(51) Int. Cl.
*G06F 11/10* (2006.01)
*H03M 13/15* (2006.01)
*H03M 13/37* (2006.01)

(52) U.S. Cl.
CPC ...... *G06F 11/1016* (2013.01); *G06F 11/1004* (2013.01); *G06F 11/1012* (2013.01); *G06F 11/1044* (2013.01); *G06F 11/1068* (2013.01); *G06F 11/1072* (2013.01); *H03M 13/1575* (2013.01); *H03M 13/373* (2013.01)

(58) Field of Classification Search
CPC ............ G06F 11/1016; G06F 11/1004; G06F 11/1012; G06F 11/1044; G06F 11/1068; G06F 11/1072; H03M 13/1575; H03M 13/37
USPC ................................ 714/763, 781, 782, 799
See application file for complete search history.

(56) References Cited

U.S. PATENT DOCUMENTS

| | | | | |
|---|---|---|---|---|
| 8,327,241 | B2 * | 12/2012 | Wu | H03M 13/1585 714/784 |
| 10,439,644 | B2 * | 10/2019 | Llani | H03M 13/3746 |
| 2018/0097528 | A1 * | 4/2018 | Ilani | H03M 13/1545 |
| 2024/0378114 | A1 * | 11/2024 | Mccrate | G06F 11/1044 |

* cited by examiner

*Primary Examiner* — John J Tabone, Jr.

(74) *Attorney, Agent, or Firm* — Wood IP Law, LLC; Theodore A. Wood

(57) ABSTRACT

Provided is a memory system comprising a plurality of memory components. The ECC decoding is configured to construct first and second codewords from a single set of data within the plurality of memory components and perform error correction code (ECC) decoding on the first and second codewords received read from the plurality of memory components wherein the ECC decoding is configured to (i) detect random errors in the first received codeword and (ii) use data associated with the detected random errors to correct erasures in the second received codeword.

19 Claims, 17 Drawing Sheets

DECODER FOR INTERLEAVED REED-SOLOMON (IRS) WITH ERASURE/COLLABORATIVE

CROSS-REFERENCE TO RELATED APPLICATIONS

This application claims benefit to U.S. Provisional Patent Application Nos. 63/480,175 and 63/480,183, both filed Jan. 17, 2023, the disclosures of which are incorporated herein in their entirety, by reference.

FIELD OF TECHNOLOGY

The following relates generally to improving reliability, availability, and serviceability (RAS) in memory devices. In particular, the disclosure relates to improved error correction code (ECC) techniques for detecting and correcting errors due to memory device failures.

BACKGROUND

Memory devices (e.g., memory media devices) are widely used to store information in various electronic devices such as computers, user devices, wireless communication devices, cameras, digital displays, and the like. Information is stored by programing memory cells within a memory device to various states. For example, binary memory cells may be programmed to one of two supported states, often corresponding to a logic 1 or a logic 0.

In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic random access memory (DRAM), synchronous dynamic RAM (SDRAM), static RAM (SRAM), flash memory, and others. Memory devices may be volatile or non-volatile. Volatile memory cells (e.g., DRAM cells) may lose their programmed states over time unless they are periodically refreshed by an external power source. SRAM memory cells may maintain their programmed states for the duration of the system being powered on. Non-volatile memory cells (e.g., Not And (NAND) memory cells) may maintain their programmed states for extended periods of time, even in the absence of an external power source.

Many memory devices comprise multiple memory components. For example, a single read or write operation from a memory controller transfers data from or to multiple memory components in parallel. Thus, a single access may comprise data stored across multiple memory devices.

Compute express link (CXL) DRAM memory devices generally require high RAS. One key reliability consideration is achieving a low annualized failure rate (AFR) and silent data corruption (SDC) rate. As known in the art, SDC occurs when a processor inadvertently corrupts the data it processes but the rest of the system is unaware of the inadvertent corruption. Lower AFRs may be achieved using ECC techniques capable of detecting and correcting errors due to failure of an entire memory component. However, these techniques can be costly in terms of parity bit requirements. These techniques are commonly known to those of skill in the art as chipkill.

ECC techniques that cannot detect and correct an entire device failure (although rare) risk generating uncorrectable errors (UEs) when a single device fails. Other failure modes (e.g., single row failure) may corrupt all data in a single read access (pre-fetch) but data in most devices are still valid. ECC techniques that cannot detect and correct all bits in any given read from a single device are at risk for generating UEs from these failure modes. Access corrupting fail modes are believed to be more common than entire die fail modes and, therefore, represent the more likely reliability risk.

BRIEF DESCRIPTION OF THE DRAWINGS

Illustrative embodiments may take form in various components and arrangements of components. Illustrative embodiments are shown in the accompanying drawings, throughout which like reference numerals may indicate corresponding or similar parts in the various drawings. The drawings are only for the purpose of illustrating the embodiments and are not to be construed as limiting the disclosure. Given the following enabling description of the drawings, the novel aspects of the present disclosure should become evident to a person of ordinary skill in the relevant art(s).

DETAILED DESCRIPTION

While the illustrative embodiments are described herein for particular applications, it should be understood that the present disclosure is not limited thereto. Those skilled in the art and with access to the teachings provided herein will recognize additional applications, modifications, and embodiments within the scope thereof and additional fields in which the present disclosure would be of significant utility.

Embodiments of the present disclosure provide ECC solutions (e.g., single-pass, interleaved, collaborative decoding techniques) that can correct up to an entire device failure in a cacheline. This need arises from the fact that some memory systems require parity symbols to be used for purposes other than ECC, such as for use as metadata. The result is that many of these memory systems lack a sufficient number of parity symbols to perform standard ECC RS decoding techniques. Newer and more efficient ECC solutions must be able to perform at least just as effectively but with fewer parity symbols.

The embodiments are configured to break up a single longer codeword into two sub-codewords. Consequently, as an example, instead of each code word having (4) symbols per device, there are now only (2) symbols for the device, and subsequently also fewer parity symbols. One benefit discovered by the inventors of the instant application is that at least one of the codewords will have enough parity symbols to do random error correction of a single device. At the same time, another codeword will lack a sufficient number of parity symbols to do random error correction but will be able to perform erasure correction.

In one exemplary solution, two codewords may be constructed from a single cacheline, with the first codeword having sufficient parity to correct a single device with random error correction and the second codeword not having sufficient parity. Error locations from the first codeword are used to mark erasures in the second codeword, enabling correction of a single device in both codewords.

Another exemplary solution uses a similar codeword construction approach but uses a collaborative interleaved Reed-Solomon (IRS) decoding technique to enable beyond half-minimum distance bounds correction. This solution, for example, improves decoding failures (e.g., UEs), offers potentially lower SDC probabilities and/or mis-correction probabilities in comparison to conventional multi-pass decoding attempt (e.g., erasure search) approaches.

These solutions offer improved performance (e.g., reduced latencies) in comparison to multi-pass approaches. The improvements largely result from two concepts. The number and complexity of the equations to calculate the error locations is reduced by leveraging an assumption that the errors are located in adjacent symbols. Additionally, more errors can be corrected using the same amount of parity. Details of these solutions are provided in the sections (and corresponding figures) below.

Figure 1:
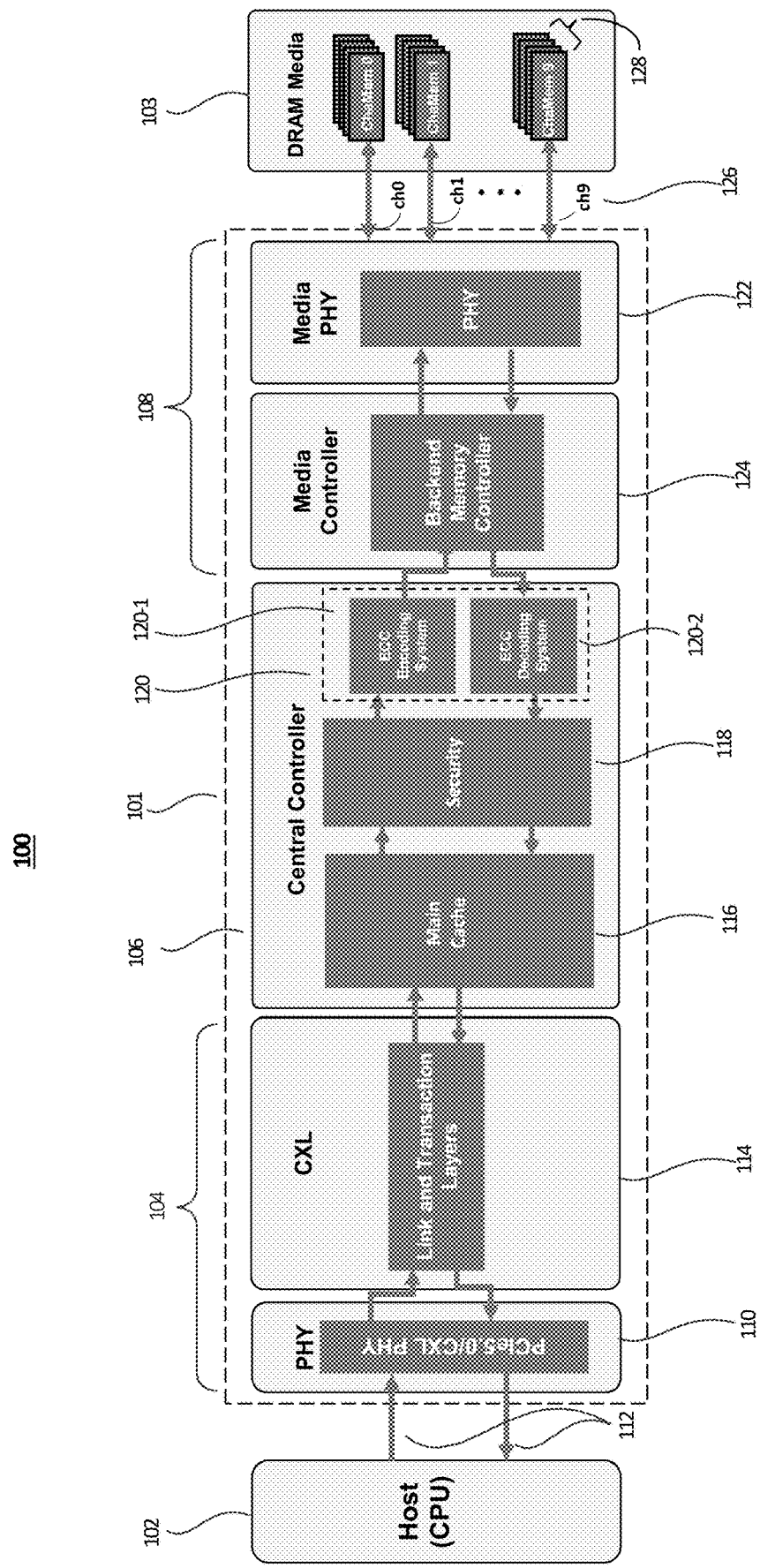
FIG. 1 illustrates a functional block diagram of a system including a host, a memory controller, and a memory array, according to an embodiment of the present disclosure.

FIG. 1 illustrates a functional block diagram of a system 100 including a host 102, a memory controller, and a memory array, according to an embodiment of the present disclosure. For example, the system 100 includes a memory controller 101 for managing transfer of data, commands, and/or instructions between the host 102 and a memory device, such as DRAM media 103.

The memory controller 101 includes a front end portion 104, a central controller 106, and a backend 108. By way of example, the host 102 can be a central processor unit (CPU), personal computer, mobile telephone, an Internet-of-Things (IoT) enabled device, or the like. The host 102 can include processing resources (e.g., one or more processors, microprocessors, or other types of controlling circuitry) capable of accessing the DRAM media 103.

The front end portion 104 may include a physical interface 110 to couple the memory controller 101 to the host 102 through input/output (I/O) lanes 112. Interface management circuitry 114 manages the interface 110. For example, the interface 110 can include suitable protocols (e.g., a data bus, an address bus, and a command bus, or a combined data/address/command bus). Such protocols may be custom, or proprietary, or may be standardized, such as the peripheral component interconnect express (PCIe), CXL, Gen-Z, cache coherent interconnect for accelerators (CCIX), or the like.

The central controller 106 can control, in response to receiving a request from the host 102, performance of a memory operation, such as reading/writing data from/to the DRAM media 103. The central controller 106 can include a main cache 116 to store data associated with performance of memory operation, and/or a security component 118 to encrypt the data before storage in the DRAM media 103.

The central controller 106 includes an ECC controller 120 to detect and correct n-bit errors that may occur in the data stored in the DRAM media 103. The ECC controller 120 includes an ECC encoding system 120-1 and an ECC decoding system 120-2. The ECC encoding system 120-1 executes encoding operations to encode the data written to the DRAM media 103. The ECC decoding system 120-2 executes decoding operations to decode the data read from the DRAM media 103.

Users are increasingly requiring that certain DRAM products have higher reliability so that a host, such as the host 102, can successfully retrieve the stored data. ECC techniques, such as chipkill noted above, are implemented to increase DRAM reliability. ECC chipkill protects data against any single DRAM component failure. As an example, an ECC technique may require additional parity bits to be stored, in addition to original user data bits. The need to store additional ECC parity bits, however, reduces the media capacity available to the host 102, increases overall costs, and increases power usage.

By way of background, a competing requirement is the ability to store other information, in addition to the ECC parity bits, on top of the original user data. CXL products, for example, are required to store metadata in certain circumstances. Thus, the need to store metadata conflicts with the need to store the additional ECC parity bits. Therefore, less costly ECC solutions (in terms of parity and die overhead) are needed to correct errors when an entire device fails or an entire read access to a device is corrupt.

An optimal ECC solution, in accordance with the embodiments, leverages (i) the ability to correct more erasures than random errors and (ii) the fact that most errors will likely be confined to a specific DRAM component. Stated another way, the odds of multiple DRAM components failing simultaneously is very low. Additionally, if the failure is a UE, determined via an ECC algorithm, then it is also likely the fault generating the UE is bounded to one faulty DRAM component.

ECC schemes capable of correcting errors using parity symbols, such as RS codes, are well known to those of skill in the art. By way of background, RS codes include a group of error-correcting codes that operate on a linear block of data called codewords. Codewords are of (n) length and include (k) data symbols, along with parity check symbols added to the data symbols, each symbol comprising(s) bits. There are (n)-(k) parity symbols. The parity check symbols enable RS codes to detect and correct multiple symbol errors.

For example, using 2(t) parity symbols, RS codes can correct combinations of erasures (v) and random errors (e) such that (v)+[(e)/2]≤(t). Additionally, a codeword may span (j) devices, with (x) symbols per device such that the entire codeword (n)=(x)*(j) symbols.

As used herein, an erasure means that a specific symbol location for one or more bits is known to be corrupt (i.e., unknown error value). The location of a random error is unknown. All that is known is that data corruption occurred. As a result, if the location of the error is known, it is possible to correct more erasures than random errors. In fact, consistent with the expression above, twice as many erasures (v) can be corrected as random errors (e). More specifically, an RS based decoder can correct up to (t) errors or up to 2(t) erasures.

Conventional ECC techniques are generally unable to efficiently detect and correct failures in certain circumstances. Included in these circumstances are cases where an entire device fails and/or cases involving all bits in a given read from a single device. These circumstances are exacerbated when the ECC scheme is constrained to (e) errors being treated as random errors (i.e., no erasure information). These constraints cause the decoder to either indicate a failure, or correct the wrong codeword, resulting in SDC. ECC solutions constructed in accordance with the embodiments, however, remedy this and other deficiencies.

In the embodiments of the present disclosure, knowledge of erasure location is leveraged to identify a single faulty DRAM component based on other DRAM component(s) that were successfully decoded. Also, knowledge that faults leading to the corruption of multiple symbols in a codeword are likely confined to a single DRAM component significantly reduces the search space (i.e., possible error location combinations) required to identify the error location, compared to other ECC techniques. ECC solutions, in accordance with the embodiments, also decrease decoding delays and reduce the occurrence of false decoding errors.

Returning back to FIG. 1, DRAM devices, such as the DRAM media 103, usually consist of identical DRAM components. Data may be stored to, and accessed from, multiple components in parallel. In these arrangements, the failure of any one component may corrupt data and result in errors.

Using exemplary RS coding principles, the ECC encoding system 120-1 stores original user data (e.g., data bits) in memory in the form of a linear block code, known as a codeword. The codeword includes the original payload or user data bits, along with a set of ECC parity bits used to check for errors in the data bits. The host 102 may later request the memory controller 101 to retrieve the stored user data. In response, the ECC decoding system 120-2 reads the codeword from the DRAM media 103, decodes the codeword to correct any errors, and provides decoded data bits to the host 102.

The backend 108 may include multiple physical layer (PHY) 122 and a media controller 124 to drive an interface 126. The interface 126 couples the memory controller 101 to channel memory devices (ChaMem0-ChaMem9) within the DRAM media 103. By way of example only and not limitation, the interface 126 includes data/parity channels (ch0-ch9) respectively corresponding to the channel memory devices (ChaMem0-ChaMem9). In one or more embodiments, the channels (ch0-ch9) may include low-power double data rate 5 (LP5) channels.

The channel memory devices (ChaMem0-ChaMem9) may be arranged in a plurality layers of memory regions forming logical memory ranks 128, each rank including one or more die (i.e., components) therein. As understood by those of skill in the art, a memory rank includes a set of DRAM chips that can be accessed simultaneously via a common chip select.

Figure 2:
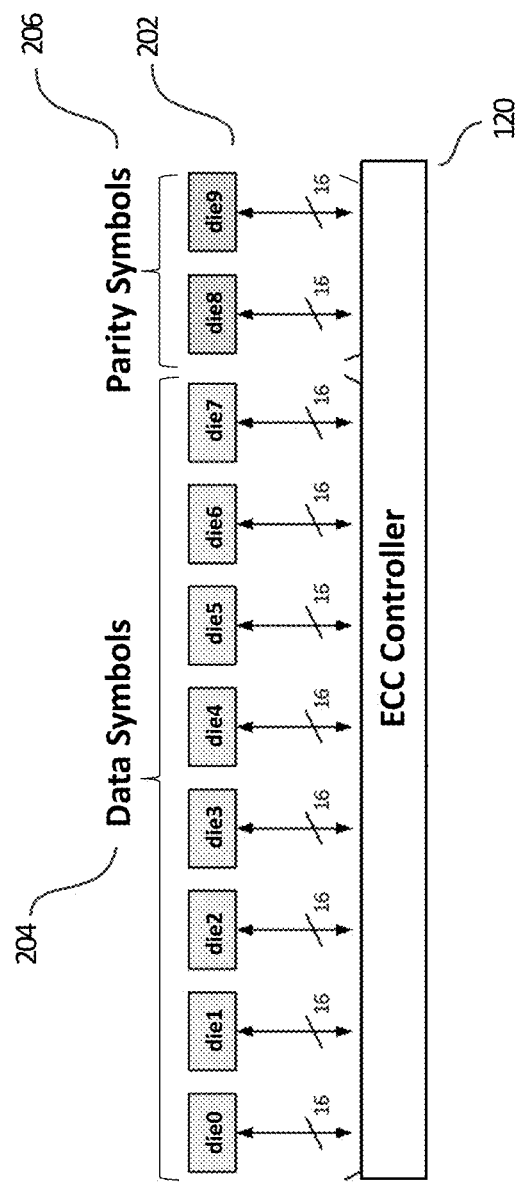
FIG. 2 illustrates an example of how symbols from a single Reed-Solomon (RS) codeword may be distributed across a plurality of DRAM devices in accordance with the embodiments.

FIG. 2 illustrates an exemplary scheme 200 of the data and parity channels (ch0-ch9) depicted in FIG. 1. Specifically, FIG. 2 illustrates DRAM memory device components 202 (die0-die9) within the channel memory devices (ChaMem0-ChaMem9), respectively. The DRAM device components (die0-die9) 202 represent one of the memory ranks 128 and are electrically coupled, at least indirectly, to the ECC controller 120. In FIG. 2 where (n) equals 44, one ECC codeword includes data from each of the DRAM device components (die0-die9) 202.

In the scheme 200, a respective portion of the ECC codeword is stored in each of the device components (die0-die9) 202. For example, eight device components (die0-die7) contain data symbols 204 and the remaining three device components (die8-die9) contain parity symbols 206. In the example of FIG. 2, each of the device components (die0-die9) 202 contributes (4) symbol bits to the ECC codeword, illustrated in greater detail in FIG. 3.

Figure 3:
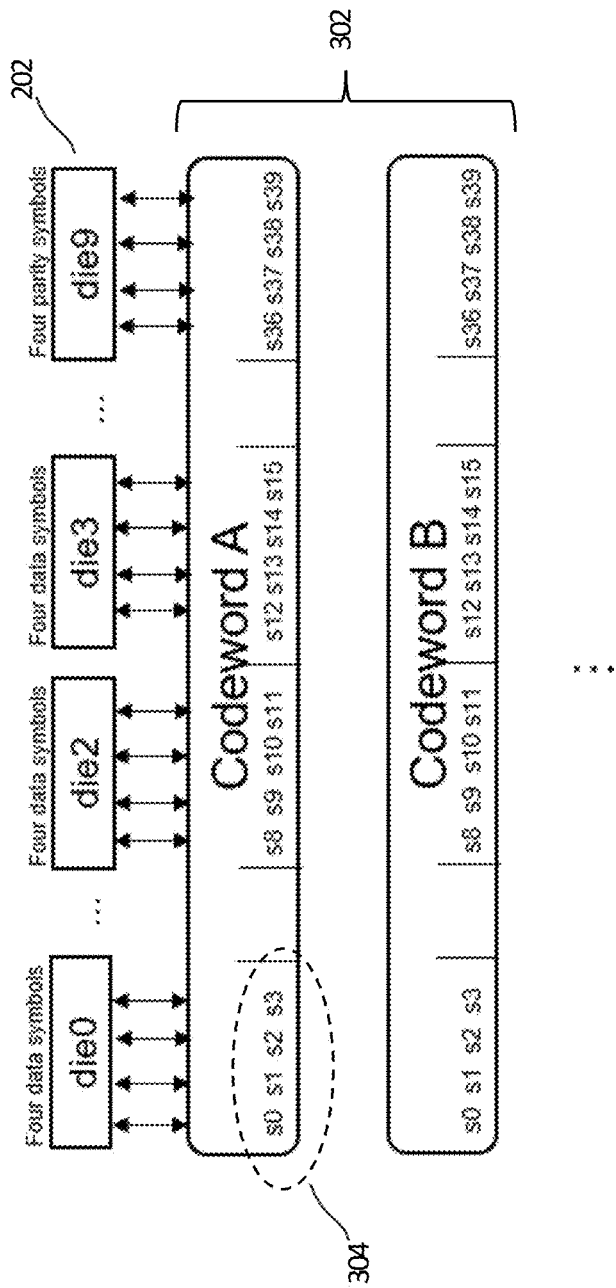
FIG. 3 illustrates exemplary data and parity channels within the computing system depicted in FIG. 1.

FIG. 3 is an illustration of an exemplary construction 300 depicting a relationship between the ECC codeword symbols with the data/parity channels (ch0-ch9). In FIG. 3, each of exemplary ECC codewords 302 (e.g., codewords A-B) includes four symbol bits 304 (e.g., s0-s3) from each of the device components (die0-die9) 202. That is, each of the ECC codewords A-B includes 10 symbols (40 bits total): 4 bits from each of the device components (die0-die9) 202.

By way of example, codeword A includes data bits (32 total) and parity bits (8 total) from each of the device components (die0-die9) 202. That is, codeword A is comprised of data symbols s0-s31 and parity symbols s32-s39. The data symbols s0-s31 and parity symbols s32-s39 correspond to the device components (die0-die9) 202, respectively. From a different point of view, data symbols s0-s3, in each of the ECC codewords 302, are associated with the device component die0.

In the embodiments, as illustrated in FIGS. 2-3, if (t)<(x)≤2(t), the codeword can be successfully decoded if the (x) symbols are correctly identified as erasures. This approach requires knowledge of the erasure locations prior to decoding. Also, erasure corrections generally require an error-and-erasure decoding algorithm (a modified version of an error-decoding algorithm).

One advantage of the ECC decoding system 120-2, in comparison to conventional ECC decoding systems, is illustrated in an example of where 2(t)=6 and (x)=4 (e.g., FIGS. 2-3). In this example, up to (3) random symbol errors can be corrected, while up to (6) erasures can be corrected. In conventional ECC decoding systems, an entire die failure, or a single read access failure on one device, cannot be corrected. These failures will result in UEs.

As background, ECC decoding algorithms exist that can correct both random errors and erasures. As used herein, an error is corruption of part of the data due to some underlying mechanism (or fault). Errors cannot be controlled and, a priori, their location in the data is unknown. By contrast, an erasure can be controlled (e.g., within the decoder). For decoding purposes, a symbol is identified as erased if that symbol is suspected of being corrupt.

Certain decoders (e.g., error and erasure decoders) can use this information to more efficiently correct the received codeword, assuming the correct symbols were identified as being corrupt. The efficiency gain is because for random errors, the decoder must determine both the location and the correct value of any errors. For erasures, however, the decoder only needs to determine the correct value for those symbols. The decision of whether to mark a symbol as erased is determined by the decoding algorithm, while the error locations are due to random events occurring in the media, such as the DRAM media 103.

The embodiments leverage the knowledge that faults generating errors in a given codeword are most likely contained within a single DRAM component. For example, the iterative ECC solution described herein can reduce the search space needed to locate these errors from (72,4)>1 million to (10,1)=18.

Figure 4:
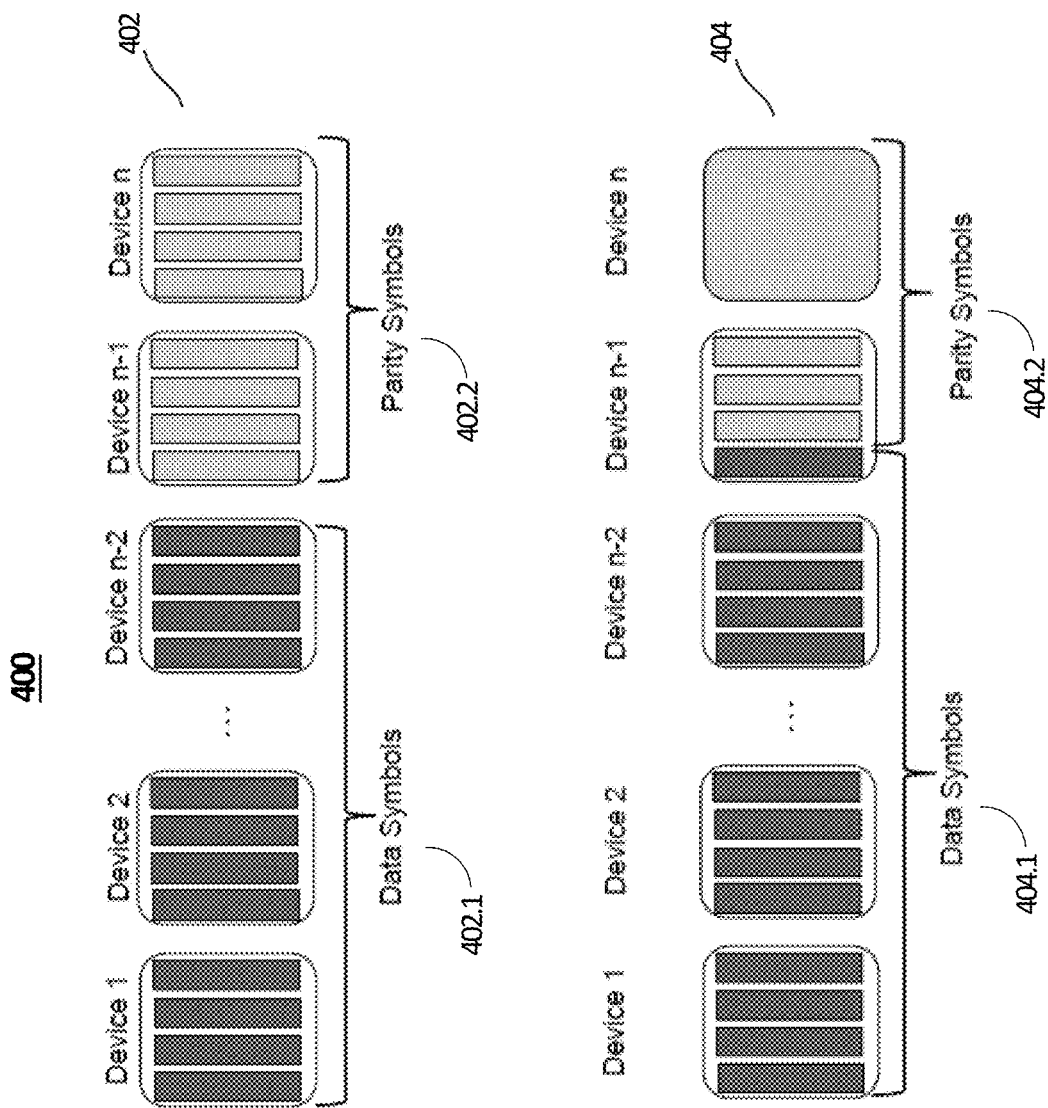
FIG. 4 illustrates the underlying ECC decoding challenges that create the need for the embodiments of the present disclosure.

FIG. 4 illustrates the underlying ECC decoding challenges that create the need for the embodiments of the present disclosure. By way of background, and as understood by one of skill in the art, heterogeneous IRS decoding uses codewords generated by interleaving two different types of codewords (e.g., RS codes) having the same length.

By way of example, the term "different types" means that the first codeword might contain more data symbols and the second codeword might contain more parity symbols. In other examples, both codewords need not be RS codewords. For example, the first codeword might be RS codes and the second codeword might be SPC codes. This latter example, discussed in greater detail below, is referred to as collaborative IRS. These interleaved codewords may then be decoded independently using decoding methods, such as erasure decoding.

Concepts such as heterogenous IRS compensate for the inability to correct a single device using one large codeword. Using these and similar concepts, two or more codewords are constructed from a single set of data (such as a cacheline) in a process known as interleaving. There are multiple ways to interleave. However, a common practice in memory applications is to divide up the total set of symbols and assign them round-robin to each of the two or more codewords. In this manner, two adjacent symbols will be in different codewords, so that if a fault impacts both symbols each codeword only needs to correct a single error.

In the instant application, interleaving is used in the same standard manner but uses the fact that the adjacent symbols (which are now in separate codewords) are more likely to fail in the decoding process. The embodiments, thereby, effectively pool information across codewords to decode more errors than would be possible when decoding the interleaved codewords separately.

In interleaving, the codes are distributed across two codewords, with one of the codewords (first codeword) being considered stronger and the other codeword (second codeword) being considered weaker. The stronger codeword contains more than enough parity symbols to correct all the fails on a single device and the weaker codeword does not. As a result, decoding information used to correct the first code (e.g., location of the fail) can be used as erasure information to correct the second codeword. For example, by using erasure decoding the second codeword can be corrected with less parity based on the erasure information derived from the first codeword.

More specifically, in FIG. 4 an exemplary illustration of the type of decoding challenges the embodiments are configured to resolve. In FIG. 4, a non-interleaved sample ECC configuration 400 is shown, including a first codeword 402 and a second codeword 404. Each of the first and second codewords 402 and 404 represent payload content associated with a prefetch or a cacheline and includes (4) symbols (the equivalent of one device).

For example, the first codeword 402 includes data symbols 402.1 and parity symbols 402.2. In the example of FIG. 4, the codeword 402 includes (8) parity symbols 402.2 and can thus correct up to (4) symbol errors [(t)=8/2=4] per device. Since the first codeword 402 can correct up to (4) symbol errors, the first codeword 402 approximates the chipkill concept.

The second codeword 404 includes data symbols 404.1 and parity symbols 404.2. Of note, the second codeword 404 includes less than (8) parity symbols 402.2 and is only capable of correcting up to (3) symbols (less than an entire device). Since the second codeword 404 can only correct up to (3) symbols, it cannot support chipkill. It also has fewer parity bits than the codeword 402 because some parity symbols could have been used for other purposes, such as metadata.

In FIG. 4, occasionally a device, for example, one of device components (die0-die9) of FIG. 2, will have some fault on the device that will corrupt stored data. One approach to solving this problem is by adding additional parity devices and using ECC techniques to correct those failures. One issue, however, is how to correct these failures in devices that are increasingly having fewer parity bits because of the need for more data bits. Thus, the challenge is how to develop effective ECC decoding solutions with fewer parity bits than standard ECC decoding techniques would require.

In DRAM devices, the faults are usually localized on a single device. For example, if there are 18 devices on a rack of DRAM memory, the odds are very unlikely that two devices will simultaneously fail. Instead, it is more likely that the failure likely be confined to the same device. It is this underlying assumption that the embodiments of the present disclosure attempt to leverage.

Figure 5:
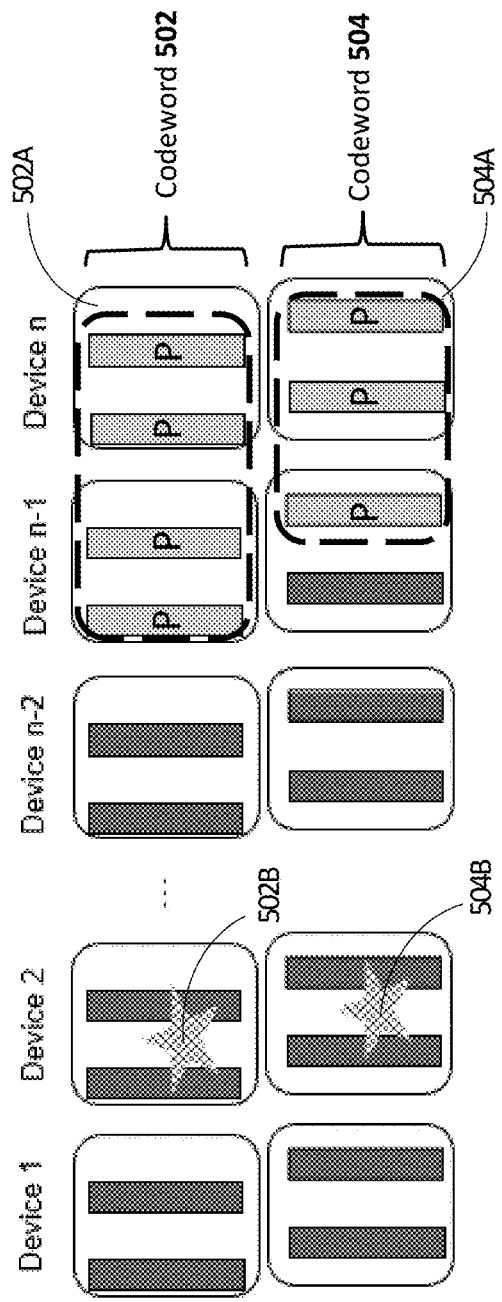
FIG. 5 illustrates an example ECC configuration including heterogeneous interleaved RS (HetIRS) with erasure decoding.

FIG. 5 illustrates an example ECC configuration 500 including HetIRS with erasure decoding, according to embodiments. The principle conveyed in FIG. 5 is that data corruption from one device (in a cacheline) will be shared across interleaved symbols from that device. As an example, the configuration 500 depicts a first codeword 502 and a second codeword 504, each having (2) symbols per each of devices 1-n. The codewords 502 and 504 are referred to as heterogeneous because they have different lengths of data/parity symbols.

In the configuration 500, chipkill can be approximated on an entire cacheline by decoding the codeword 502 and identifying any symbol error locations. The symbol error locations from the decoding of the codeword 502 can be used as erasure locations for the decoding of codeword 504. The codeword 504 needs at least (1) erasure location to correct the entire device.

FIG. 5 represents performance of interleaving with less than (8) total parity symbols. Therefore, the codeword 502 includes (4) parity symbols 502A, and the codeword 504 includes (3) parity symbols 504A for a total of (7) parity symbols. Since the codeword 502 has a larger number of parity symbols, sufficient to approximate chipkill, the codeword 502 is considered the strong codeword and the codeword 504 is considered the weak codeword. Additionally, FIG. 5 supports an assumption that large faults (i.e., errors) 502B and 504B span the codewords 502 and 504, respectively. As shown, the faults 502B and 504B occur in device-2.

By way of example, during operation of a first decoder (e.g., within the ECC decoding system 120-2, discussed in greater detail below), the codeword 502 is decoded using a standard random error correction process to determine that device-2 failed. The strong codeword 502 can correct all the symbols in a single device, needing only (2) symbols. The weak codeword 504, however, may only correct a device if the strong codeword 502 identifies at least (1) symbol error.

Thus, the failure information, derived from decoding the strong codeword 502 first, is fed to a second decoder to aid decoding and correction of the weak codeword 504. Stated another way, the embodiments permit correction of the codeword 504 based on knowing which device failed from the codeword 502. By way of review, erasure decoding may be used since it enables correction of erasures with only half as many symbols as needed for random error correction (i.e., RS decoding can correct up to (t) errors or up to 2(t) erasures).

The erasure information for the codeword 502 is passed to the second decoder for generation of syndromes of all possible correctable errors. The syndromes are used to calculate error location polynomials (ELPs) and erasure locations that are used later in the ECC decoding process for the codeword 504, discussed below. In the embodiments, a slightly different decoder and logic is used for the codewords 502 and 504 and to pass information from one of the codewords to the other codeword.

Figure 6:
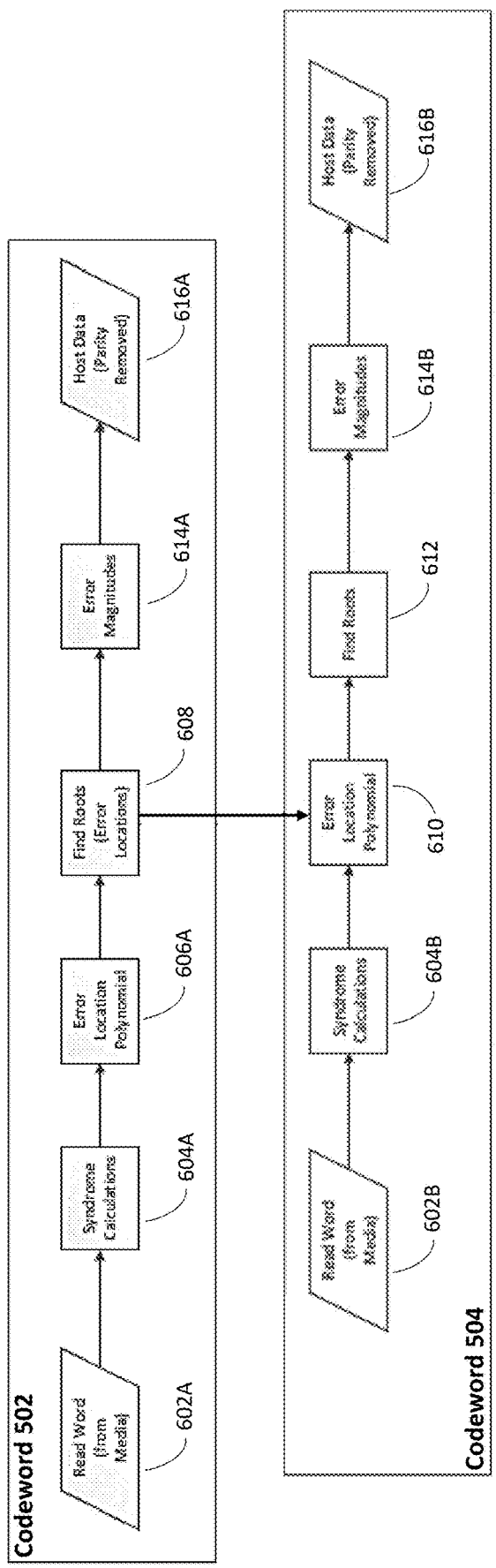
FIG. 6 illustrates a flowchart of an exemplary method of performing HetIRS with erasure decoding, in accordance with the embodiments.

FIG. 6 illustrates a flowchart of an exemplary method 600 to perform HetIRS with erasure decoding, in accordance with the embodiments. In the method 600, as described in relation to the configuration 500 of FIG. 5, the codeword 502 is used to find error locations in the codeword 504 as the codeword 502 contains sufficient parity to correct all symbols in one device. The codeword 504 lacks sufficient parity to correct all the symbols in the one device. The exemplary solution, illustrated in FIG. 6, parallelizes the decoding paths for both of the codewords 502 and 504 and performs decoding in an interleaved manner, as shown in FIG. 6.

To initiate the method 600 the ECC decoding system 120-2 receives the read word for the codeword 502 from the media 103 (or cacheline) in block 602A and begins decoding in a first decoder. In block 604A, the syndromes are calculated (as noted above) and are used to generate the ELPs, in block 606A. In block 608, the roots of the ELPs are calculated. As understood by those of skill in the art, polynomial roots represent values where the polynomial function is equal to zero. In the instant application, the calculated roots are used to identify the error locations, which are then passed to the codeword 504 decoder at block 610. Roots are calculated at block 612 and error magnitudes for the codeword 502 are calculated in block 614A (discussed in greater detail below). The corrected codeword is passed to the host device in block 616A.

The codeword 504 uses the error locations from the codeword 502 as erasure positions in its decoding, which is performed in a second error and erasure decoder (e.g., within the ECC decoding system 120-2). The second error and erasure decoder performs all the other blocks of the codeword 504. As discussed above, less parity is required to decode erasures vs random errors. As a result, using the error locations from the codeword 502 enables single device correction in codeword 504 even though it has less parity than codeword 502. All of the action blocks within the codeword 504 process (602B, 604B, 608B, 614B, and 616B) are performed by the codeword 504 decoder in the same manner as performed in the blocks 602B, 604B, 608B, 614B, and 616B to the action blocks of the codeword 502 decoder.

Figure 7:
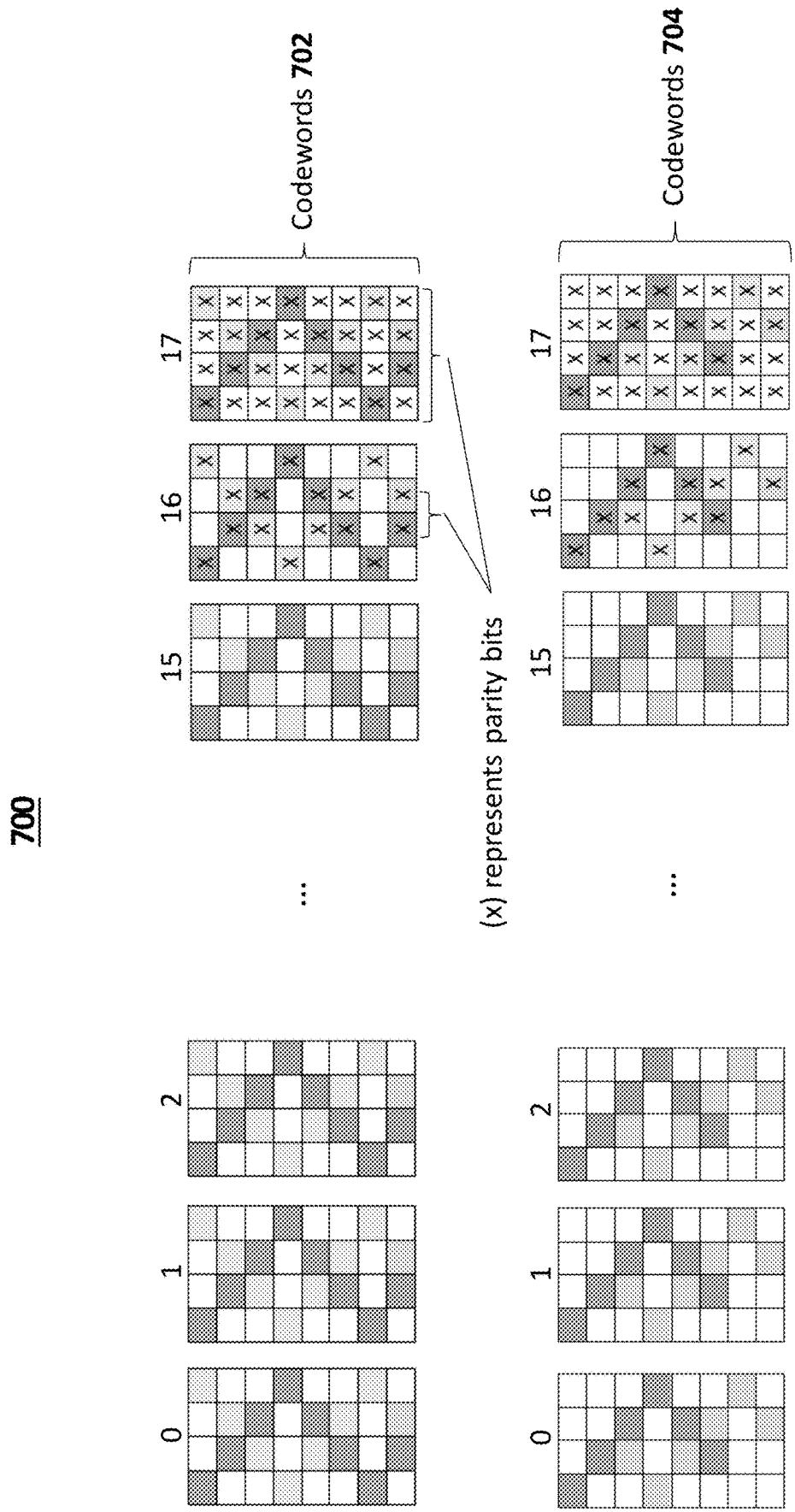
FIG. 7 illustrates an exemplary configuration that extends a single RS codeword with multiple single parity correction (SPC) codewords.

FIG. 7 illustrates an exemplary configuration 700 that extends a single RS codeword with multiple SPC codewords. That is, the concepts discussed above in relation to FIGS. 5 and 6 need not be limited to RS codes. The basic idea of the configuration 700 is that once it is known which devices failed, to recover the data with SPC, the exclusive OR (XOR) of all the bits of the remaining devices may be taken together. That process will recover the data for whichever devices have failed.

By way of example only and not limitation, the configuration 700 demonstrates an implementation that combines an RS codeword, spanning all devices, with SPC codewords that also span all the devices. The RS codeword contains sufficient parity to correct a single device failure by identifying the failing device. The SPC codewords can correct the remaining bits in the failing device once the identity of the failing device is known.

Thus, FIG. 7 is another example of leveraging knowledge of which device failed (from the RS code) to subsequently correct fails based on a different code (e.g., SPC codewords). An advantage of this approach is that it is easier than RS decoding because it is merely XORing data together. Thus, there are no complicated RS code polynomials. Another advantage in the approach of FIG. 7, is the ability to significantly reduce required parity bits. The metadata bits available=(number of bits/codeword/device)−(1*m), where (I) is the RS symbols/codeword/device, and
where (m) is the symbol size.

For example, using 8-bit symbols with 32 bits/codeword/device, and (2) RS symbols/codeword/device=16 metadata bits. SPC codes provide more flexibility for RS symbol sizes, since bits/codeword/device no longer must be a multiple of the RS symbol size.

In the configuration 700 of FIG. 7, the darker squares represent bits associated with the RS codeword. The white squares represent bits associated with the SPC codeword. The (x)'s are parity bits for either RS or SPC codes. Codewords 702 consist of 16 SPC codewords of 18-bit length where correction of a failing device is provided by XOR'ing data from all devices except the failing device for each of the SPC codewords.

The error position in the codewords 702 is discovered by the RS code and correction of the shaded area is provided by the RS code and the correction of the white area is provided using redundant array of independent disk concepts. Using 6-bit symbols provides greater metadata (20-bit) and produces the solution of codewords 704.

Figure 8:
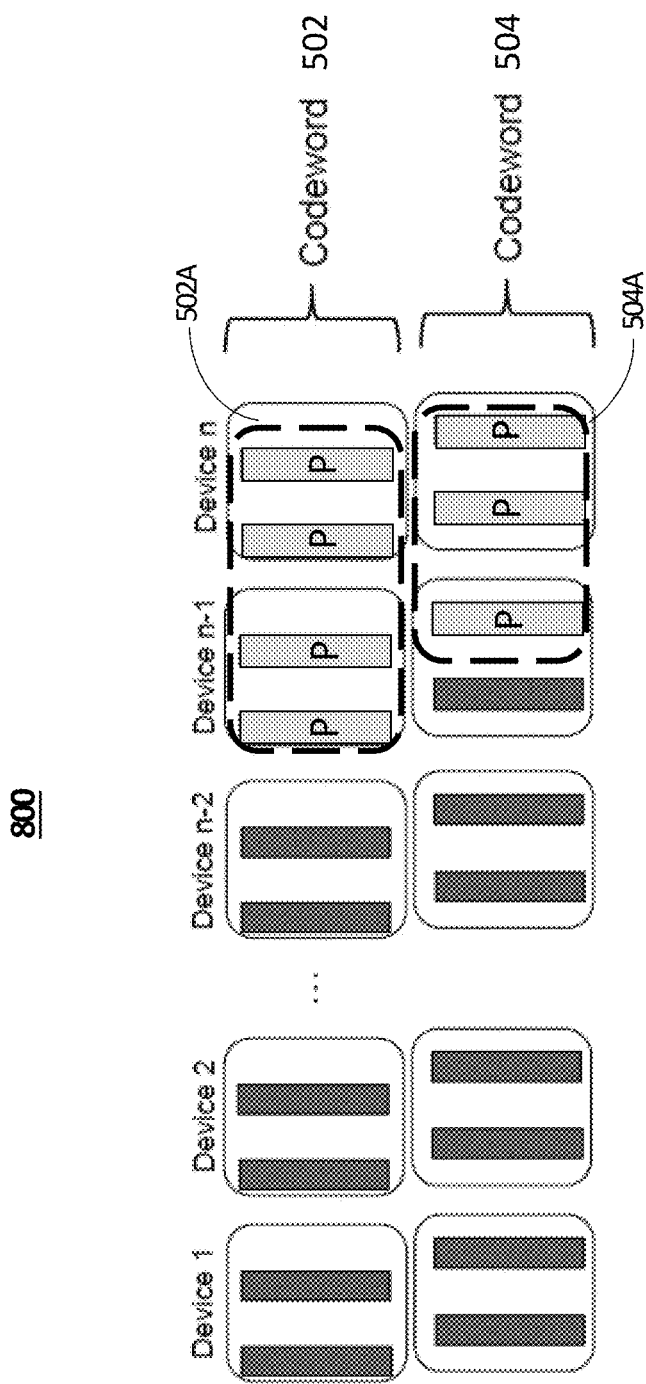
FIG. 8 illustrates an exemplary configuration demonstrating collaborative (HetIRS) decoding solution.

FIG. 8 illustrates an exemplary configuration 800 demonstrating a collaborative heterogeneous IRS decoding solution, in accordance with the embodiments. Collaborative decoding includes solving error locations across codewords simultaneously by interleaving two (or more) different RS codes and pooling the decoding information together. This solution extracts more performance out of the correction capability. For example, this solution improves the error correction balance and enables the correction of codewords beyond the standard RS capability of half the minimum distance. Also, this solution is faster and only requires a single decoding pass.

The term "different RS codes," as used herein, means although the codewords have the same length (i.e., total number of symbols), they do not need to have the same number of data and parity symbols. The number of data and parity symbols can vary between the different codewords. The IRS collaborative decoding solution, described herein, is not deterministic beyond the standard RS bound, but has a small failure probability. The specific correction capability depends on the number of interleaved codewords and their individual capabilities.

This solution of FIG. 8 implements a modified shift register synthesis approach that only requires a single decoding pass. The error location calculation, however, increases in complexity by a factor of (l), where (l) is the number of interleaved codewords. An assumption is made that fails will occur on the same symbol positions across interleaved codewords.

One well known decoding technique is the register synthesis approach. This approach is demonstrated in the shift register synthesis table (Table 1) below and uses a multiple shift register synthesis system to generate a single ELP for all interleaved codewords simultaneously. This synthesis process effectively extracts additional syndrome equations from each codeword, enabling solutions for locating more errors than possible from an individual codeword.

The underlying principles of the shift register synthesis method used herein are described in a paper by Georg Schmidt, Member IEEE, "Collaborative Decoding of Interleaved Reed-Solomon Codes and Concatenated Code Designs," IEEE Transactions on Information Theory, Vol. 55, No. 7, July 2009. Other aspects of the embodiments use modifications to Berlekamp-Massey algorithm (BMA). The BMA is well known to those of skill in the art. The shift register solution herein will be referred to as the modified BMA shift register technique.

TABLE 1

Shift-Register Synthesis input: $S^{(l)} = \{S_i^{(l)}\}_{i=0}^{N-K^{(l)}-1}$, $l = 1, \ldots, 1$
$M \leftarrow \max_{1 \leq l \leq 1}\{N - K^{(l)}\}$
$M^{(l)} \leftarrow N - K^{(l)}$, $l = 1, \ldots, 1$
$t \leftarrow 0$, $\Lambda(x) \leftarrow 1$
$m^{(l)} \leftarrow M - M^{(l)}$, $t^{(l)} \leftarrow 0$, for $l = 1, \ldots, 1$
$\Lambda^{(l)}(x) \leftarrow 0$, $\Delta^{(l)} \leftarrow 1$, for $l = 1, \ldots, 1$
for each m from 0 to M − 1 do
| for each l from 1 to l do ⇐══ (Iterated loop)
| | if m − t > M − $M^{(l)}$ then
| | | $\Delta \leftarrow S_{m-M+M^{(l)}}^{(l)} + \sum_{i=1}^{t} \Delta_i S_{m=M+M^{(l)}-i}^{(l)}$
| | | if $\Delta \neq 0$ then
| | | | if $m - m^{(l)} \leq t - t^{(l)}$ then
| | | | L
| | | | $\Lambda(x) \leftarrow \Lambda(x) - \frac{\Delta}{\Delta^{(l)}} \Lambda^{(l)}(x) x^{m-m^{(l)}}$
| | | | else
| | | | | $\bar{t} \leftarrow t$, $\bar{\Lambda}(x) \leftarrow \Lambda(x)$
| | | | | $\Lambda(x) \leftarrow \Lambda(x) - \frac{\Delta}{\Delta^{(l)}} \Lambda^{(l)}(x) x^{m-m^{(l)}}$
| | | | | $t \leftarrow m - (m^{(l)} - t^{(l)})$
| | | | | $t^{(l)} \leftarrow \bar{t}$, $\Lambda(l)(x) \leftarrow \bar{\Lambda}(x)$
| | | | L $\Delta^{(l)} \leftarrow \Delta$, $m^{(l)} \leftarrow m$
| | | L
| L
Output: $t$, $\Lambda(x)$ In the embodiments, the decoder iterates the loop (L) from (1)-(L) over all the codewords that are interleaved. This process includes tracking multiple registers and updating the value of each register on each pass. That is, the decoder iterates through all of the codewords to perform updates based on the different codewords.

Returning to FIG. 8, the exemplary configuration 800 demonstrates application of collaborative HetIRS to the codewords 502 and 504 (parity symbols 502A and 504A) illustrated earlier in the configuration 500 of FIG. 5. The configuration 800 demonstrates that using collaborative HetIRS provides slightly better performance correcting the codewords 502 and 504 than achieved using HetIRS with erasure decoding. Specifically, the configuration 800 can correct up to (2) errors per codeword in both of the codewords 502 and 504. The configuration 500 of FIG. 5, however, can only correct errors in one codeword.

Figure 9:
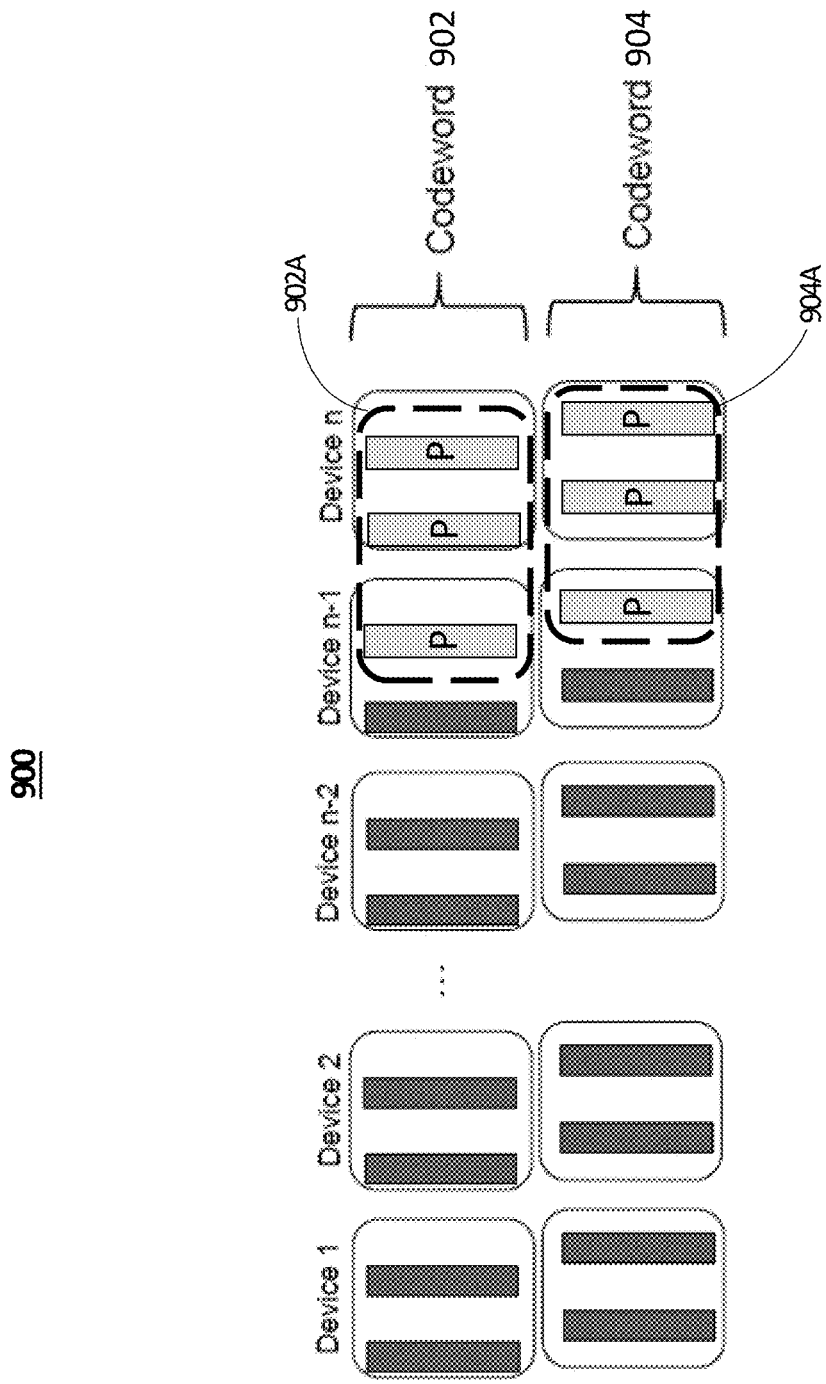
FIG. 9 illustrates an exemplary configuration implementing a collaborative homogeneous interleaved RS (IRS) decoding solution.

As shown in FIG. 8, the configuration 800 performs interleaving with (7) total parity symbols and supports high probability chipkill. Additional details of the configuration 800 are:

HetIRS with (l) = 2
Kbar (avg. data/information symbols) = (32 + 33)/2 = 32.5
Kcarrot (max data/information symbols) = 33
$t < t_{max}$ = min (2/(2+1)*(36−32.5), (36−33)) = min (2.33, 3) = 2.33
the decoder can correct up to (2) errors per codeword in both codewords 502 and 504
$t_g$ = 1 error, so there is a finite probability that t = 2 errors is uncorrectable FIG. 9 illustrates an exemplary configuration 900 implementing a collaborative homogeneous IRS decoding solution to correct codewords 902 and 904 having parity symbols 902A and 904A, in accordance with the embodiments. The configuration 900 performs interleaving with (6) total parity symbols, supports high probability chipkill, and achieves slightly better performance than the configuration 800 of FIG. 8. For example, using homogeneous IRS the decoding of FIG. 9 can still correct a single device although there is one less parity symbol (6 total) than the configuration 800. The codeword 902 is not needed to correct two symbols independently. The configuration 900 is particularly advantageous if stronger error correction is needed of more metadata bits or other extra bits are needed for other purposes. Additional details of the configuration 900 are:

Homogeneous IRS with (l) = 2
Kbar (avg. data/information symbols) = (33 + 33)/2 = 33
Kcarrot (max data/information symbols) = 33
$t < tmax$ = min (2/(2+1)*(36−33), (36−33)) = min (2, 3) = 2
the decoder can correct up to (2) symbols collaboratively (high probability) although neither codeword could correct individually.
Leaves an "extra" symbol for additional purposes (metadata/check).

Figure 10:
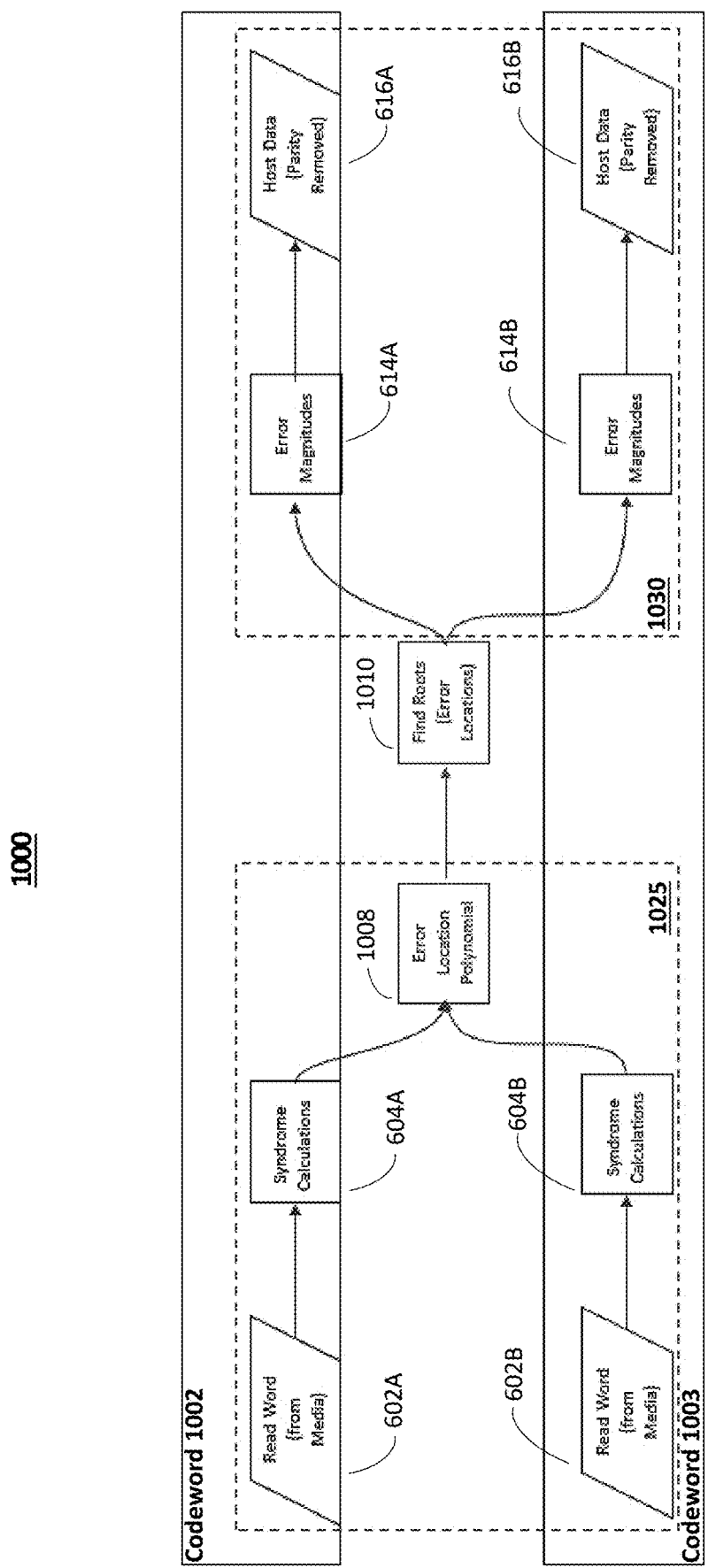
FIG. 10 illustrates a flowchart of an exemplary method of performing IRS with collaborative decoding.

FIG. 10 illustrates a flowchart of an exemplary method 1000 of performing IRS with collaborative decoding codewords 1002 and 1003, in accordance with the embodiments. The method 1000 leverages the assumption that the error positions are the same in both codewords and faults will likely impact the same symbols. In FIG. 10, the codeword 1002 contains sufficient parity to correct all symbols in one device, while the codeword 1003 does not.

In FIG. 10, syndromes are computed for each of the codewords 1002 and 1003 separately (in different codeword decoders) in steps 604A/604B. A process super-block 1025 includes blocks 602A/602B (words read from memory) and 604A/604B performed in the manner described above in relation to FIG. 6. The results (e.g., syndrome calculations 604A/604B) are combined or pooled together, to calculate a single ELP across the codewords 1002 and 1003, at block

1008. The ELP calculation uses the modified BMA shift register technique to produce the ELP for both codewords. Although FIG. 10 shows two codewords (e.g., codewords 1002 and 1003), the number of codewords in the embodiments could be more than two codewords and the single codeword ELP of block 1008 would apply to all of the codewords.

A set of polynomial roots is computed from the single ELP (block 1008) at block 1010 to identify the error locations. Decoding will still fail if the number of distinct roots in the appropriate field does not match degree of the polynomial. Error magnitudes are calculated for each error position separately, at blocks 614A/614B, in codewords 1002 and 1003 as the error magnitudes themselves may be different. Once it is known which symbols have failed, the error magnitudes can be calculated. The corrected codewords are sent to the host 102, as blocks 616A/616B (within process super-block 1030.

To initiate the method 600, the ECC decoding system 120-2 receives the read word for the codeword 502 from the media 103 (or cacheline) in block 602 and begins decoding. In block 604, the syndromes are calculated (as noted above) and are used to generate the ELPs, in block 606. In block 608, the roots of the ELPs are calculated. As understood by those of skill in the art, polynomial roots represent values where the polynomial function is equal to zero. In the instant application, the calculated roots are used to identify the error locations, which are then passed to the codeword 504 decoder at block 610.

The codeword 504 uses the error locations from the codeword 502 as erasure positions in it is decoding, which is performed in an error and erasure decoder. The error and erasure decoder performs all the other blocks of the codeword 504. As discussed above, less parity is required to decode erasures vs random errors. As a result, using the error locations from the codeword 502 enables single device correction in codeword 504 even though it had less parity than codeword 502. All of the action blocks within the codeword 504 process (602.1, 604.1, 608.1, 612.1, and 614.1) are performed by the codeword 504 decoder identically to the action blocks of the codeword 502. For simplification of later reference in the instant application, FIG. 10 uses the two process super-blocks 1025 and 1030 in describing the method 1000.

Figure 11:
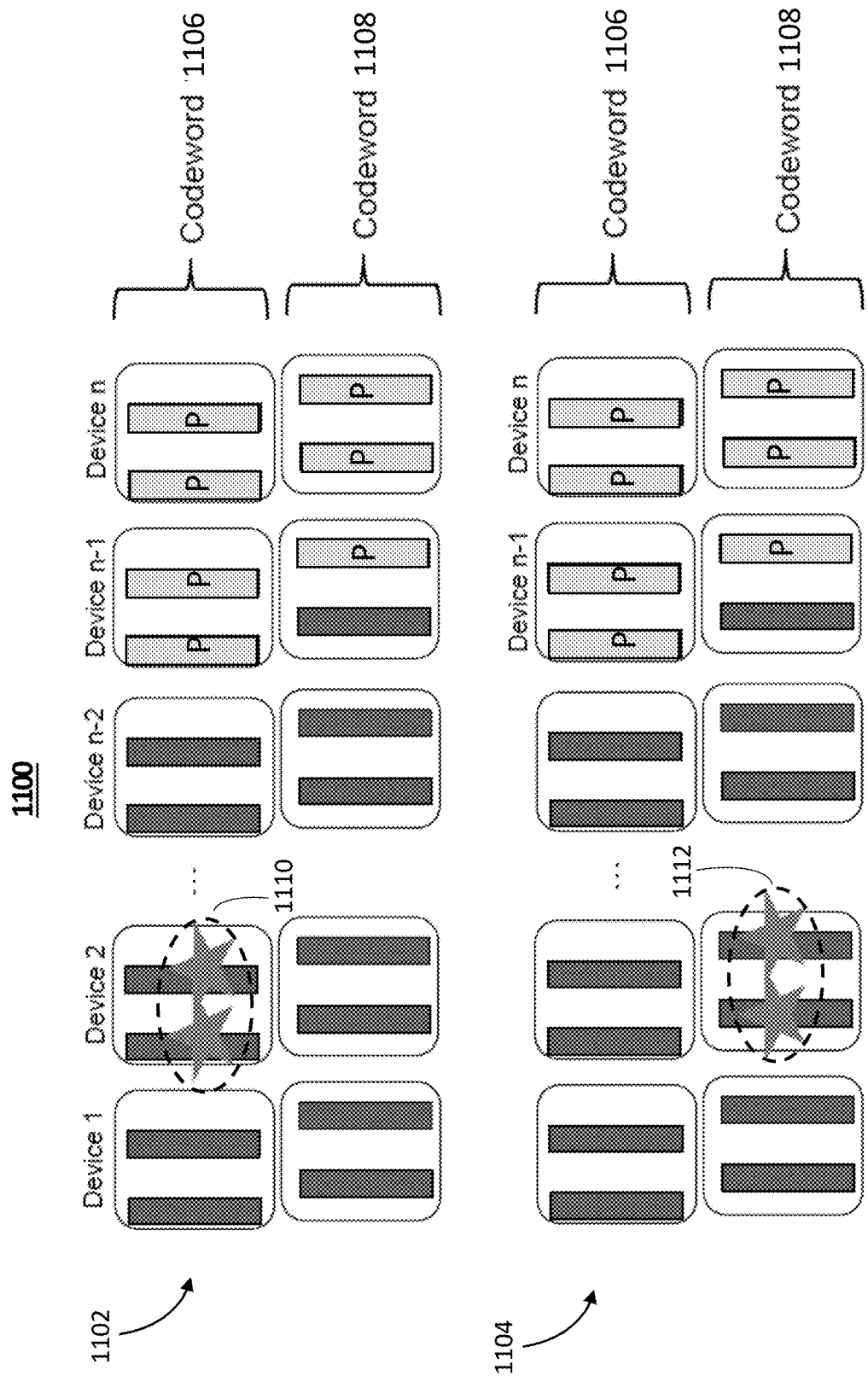
FIG. 11 illustrates a configuration presenting a decoding corner case where both HetIRS and IRS with collaborative decoding solutions could fail.

FIG. 11 illustrates a configuration 1100 depicting a decoding corner case where both HetIRS and IRS with collaborative decoding solutions (e.g., FIGS. 5 and 8) could fail, based on error patterns. That is, a scenario exists where multiple symbols in one code word are corrupt, but there are not as many fails in the other codeword. As a result, both HetIRS and IRS with collaborative decoding solutions could fail.

By way of example, FIG. 11 depicts two alternative scenarios (1102 and 1104) for the same set of codewords (1106 and 1108). In the scenario 1102, corruption of both symbols 1110 (device-2) in the codeword 1106 (but not the codeword 1108) is correctable for HetIRS. However, in the scenario 1104, corruption of both symbols 1112 in the codeword 1108 (but not codeword 1106) is not correctable. Thus, a failure in the codeword 1106 only, is correctable for HetIRS (scenario 1102). However, failure in the codeword 1108 only is not correctable (scenario 1104).

Occurrences such as scenario 1104 could occur if a fault corrupts two or more bits from the codeword 1108 only. Eliminating this risk is not possible but it may be possible to reduce the risk to acceptable levels. One approach to mitigating scenarios where fails corrupt symbols in only one of the two codewords is described in relation to FIG. 12.

Figure 12:
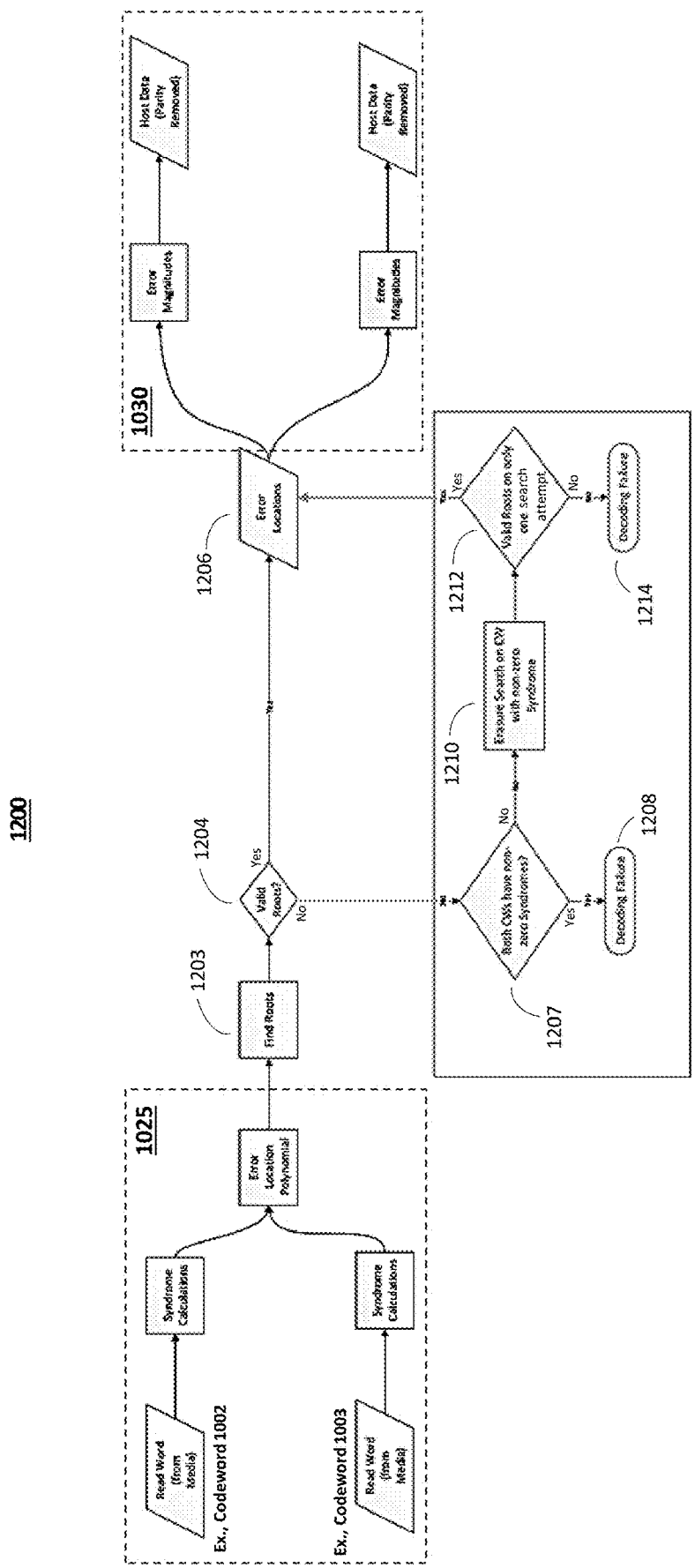
FIG. 12 illustrates a flowchart of an exemplary method for mitigating ECC decoder corner cases.

FIG. 12 illustrates a flowchart of an exemplary method 1200 for collaborative decoding with erasure search to recover corner fails. At a high-level, the method 1200 solves the corner case problem by executing an erasure search routine, as described below. The method 1200 begins by performing each of the action blocks within the super-block 1025 of the method 1000 (FIG. 10), including reading the codeword from the media 103, calculating the syndromes, and determining the ELP. The ELP, output from the super-block 1025, is used to derive the roots of the ELP in block 1203. If the roots are determined to be valid at block 1204, the derived roots are used to determine the error locations at block 1206, whose output is supplied to the super-block 1030. In the super-block 1030, the codeword is corrected and output to the host 102.

If the roots are determined to be invalid at the block 1204, an analysis is performed at block 1207 to determine if all of the codeword syndromes have non-zero values. A non-zero syndrome value indicates an error in the received word. If all codewords have non-zero syndrome values, a decoding failure is declared at block 1208. If any of the syndromes have non-zero values, and erasure search is performed for the codeword with the non-zero value at block 1210.

Multiple symbol errors in a codeword are likely to be the result of a fault on a single memory device. Therefore, an erasure search is performed. During the erasure search, all symbols from the first device are marked as erased and try to decode using an error and erasure decoder. If decoding is successful, this first device is a failure candidate. This process is repeated for all remaining devices. If only a single successful attempt is found, then it is known that the first device is the failed device. Also known is that the correction attempt, corresponding to that first device, is valid. Otherwise, a decoding failure is declared.

Additional details for conducting codeword erasure searches are provided in Applicant's co-pending Patent Application entitled Iterative Decoding Scheme for Correcting DRAM Device Failures, application Ser. No. 17/896,957, filed Aug. 26, 2022 the disclosure of which is incorporated herein in its entirety, by reference.

In block 1212, a determination is made whether valid roots for the syndrome values were found in only (1) attempt. If more than (1) attempt was tried, a decoding failure is declared at block 1214. If only (1) attempt was required, the error location information is derived at block 1206 and the output is fed to the subsection 1030 for application to (and correction of) each of the codewords (e.g., 1002 and 1003). The corrected codewords are output to the host 102.

Figure 13:
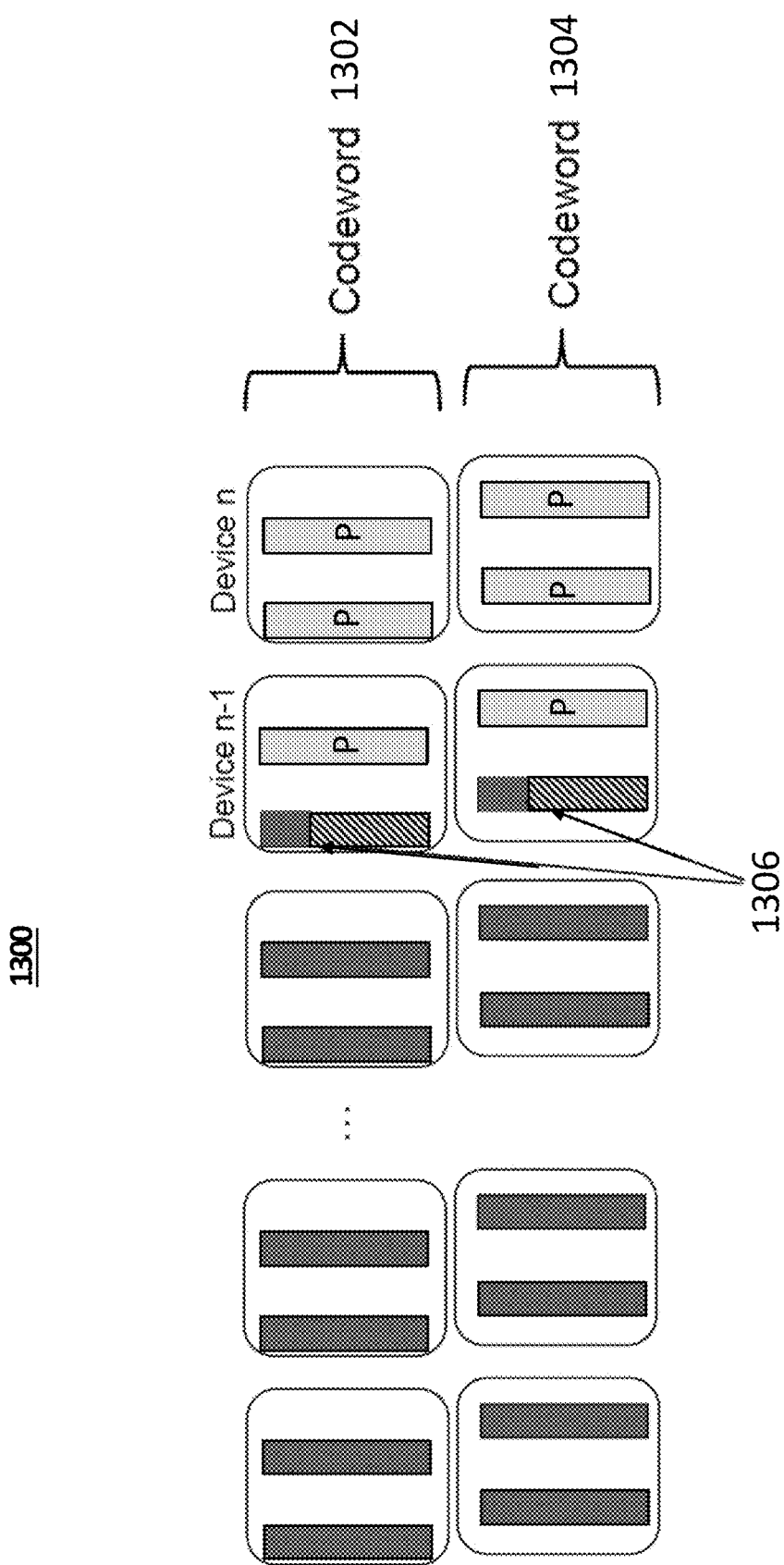
FIG. 13 illustrates an exemplary configuration for decoding error checks with spare bits, in accordance with the embodiments.

FIG. 13 illustrates an exemplary configuration 1300 for decoding error checks with spare bits. HetIRS and homogeneous IRS approaches supporting metadata have a number of spare bits in one symbol per codeword (1306). These bits may be used for parity or a post-decoding cyclic redundancy check (CRC) over the codeword (e.g., codewords 1302 and 1304).

Figure 14:
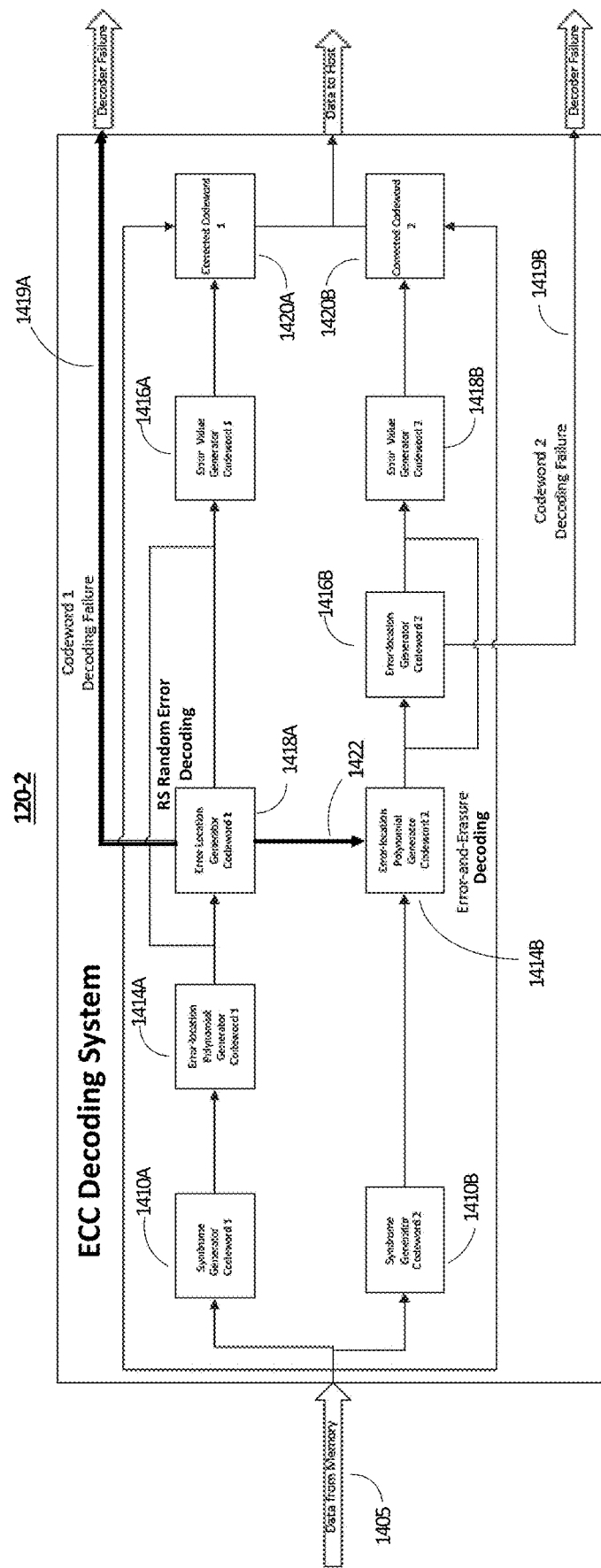
FIG. 14 is a more detailed illustration of the exemplary ECC decoding system depicted in the system of FIG. 1.

FIG. 14 is a more detailed block diagram illustration of the ECC decoding system 120-2 of FIG. 1. The ECC decoding system 120-2 includes syndrome generators 1410A/1410B that respectively receive interleaved codeword 1 and codeword 2 data 1405 from the memory 103. The codeword 1 and codeword 2 data 1405 is split into separate paths for input to the syndrome generators 1410A/1410B. The codeword 1 and codeword 2 data 1405 is also respectively provided to corrected codeword 1 and codeword 2 modules 1420A/1420B.

A non-zero syndrome value, calculated in the syndrome generators 1410A/1410B, indicates an error in the received codeword. The syndrome value is an intermediate error correction step for identifying the location of a single error in the codeword. ELPS for the syndromes are calculated in ELP generators 1414A/1414B, respectively. In the embodiments, the error location polynomial generators 1414A/1414B calculate ELPs. The ELPs accumulate information about possible erasures for later use within the ECC decoding system 120-2.

In one exemplary embodiment, the polynomial generators 1414A/1414B calculate error location polynomials based upon iterative Berlekamp Massey algorithm (BMA) concepts. The BMA is one exemplary approach for solving a series of functions to generate the error location polynomials over finite fields. Detailed operation of the BMA is well known to those of skill in the art. Accordingly, detailed operation of the BMA will not be provided herein.

Other approaches for deriving the error location polynomials, such as Euclid's algorithms, are known and are within the spirit and scope of the embodiments. In FIG. 14, the error location polynomial generator 1414A provides the calculated ELPs to error location generator 1418A and error value generator 1416A.

The error value generator 1416A calculates/confirms the error values at known error locations and provides corrected codeword 1 data to the corrected codeword 1 module 1420A. By way of example only, and not limitation, one approach for calculating the error values is based on the Forney algorithm. General operation of the Forney algorithm is also well known to those of skill in the art. Accordingly, details of the Forney algorithm will not be provided herein.

The error location generators 1418A/1418B conduct a search of possible error location combinations to find an error evaluation value that confirms the location of specific errors. In one embodiment, the error location generators 1418A/1418B implement a Chien search scheme to conduct the search of the possible error locations. If the search fails, the ECC decoding system 120-2 declares a decoding failure and the host 102 is notified of a UE along data paths 1419A/1419B, respectively.

In the ECC decoding system 120-2, error location information from the error location generator 1418A is fed to the error location polynomial generator 1414B along data path 1422 to facilitate correction of codeword 2. The error location information output from the error location generator 1418A is error location information learned from decoding codeword 1 using standard RS random error decoding. The error location polynomial generator 1414B decodes the codeword 2 (as a function of codeword 1 error location information) using error and erasure decoding. In an exemplary embodiment, more parity symbols are assigned to codeword 1 to facilitate correction of an entire device. Error and erasure data output from the error location polynomial generator 1414B is supplied to the error location generator 1416B and error value generator 1418B.

Updated codeword 2 data is fed to corrected codeword 2 module 1420B. The corrected codeword 2 module compares codeword 2 data output from the error value generator 1418B with original codeword 2 data 1405 input from the memory 103 to produce a corrected codeword 2. This process occurs in a similar manner along codeword 1 data paths input to the corrected codeword 1 module 1420A.

Outputs from the corrected codeword 1 and codeword 2 modules 1420A and 1420B are combined together and supplied to the host 102.

Figure 15:
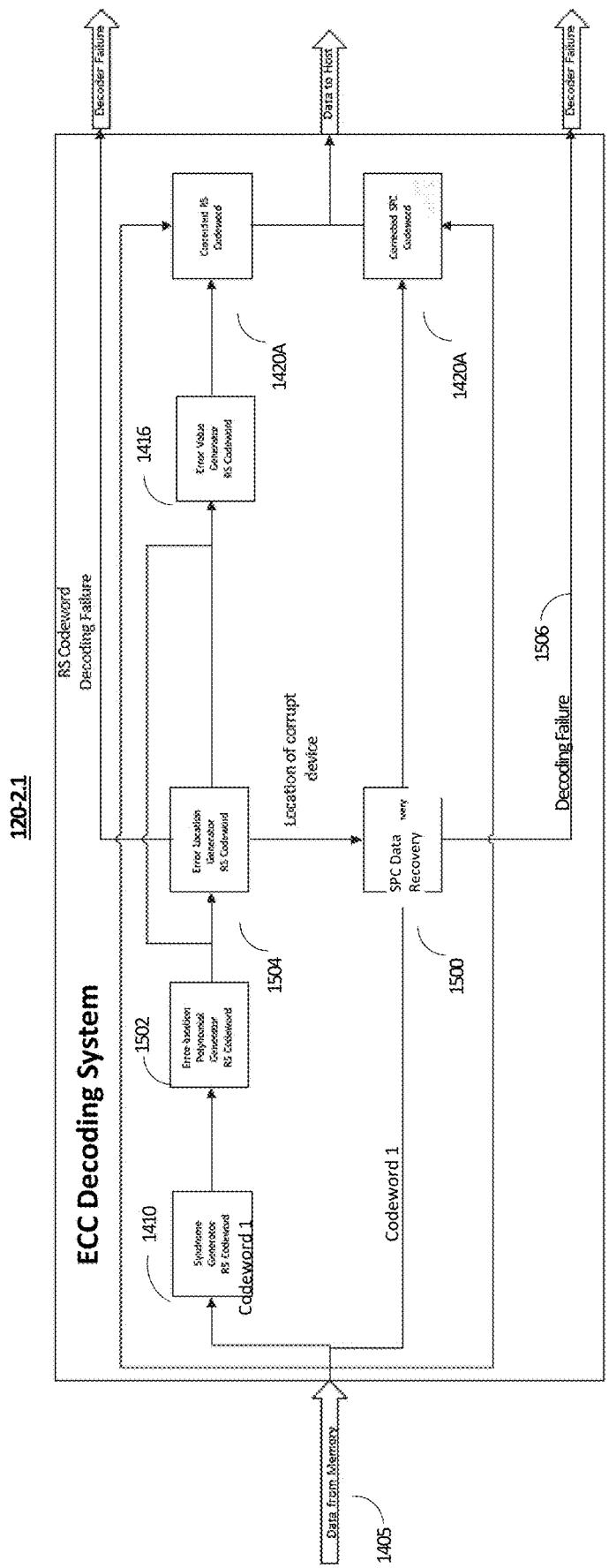
FIG. 15 illustrates an alternative ECC decoding system to the system of FIG. 14 and configured to perform RS SPC decoding.

FIG. 15 illustrates an exemplary ECC decoder 120-2.1 configured to implement SPC decoding. In FIG. 15, the ECC decoding system 120-2.1 is configured to function as an RS SPC decoder. By way of example only, and not limitation, an assumption is made that codeword 1 has sufficient parity to correct a single device.

As a preliminary matter, in the instant application, each of the exemplary internal components of the ECC decoder 120-2.1 that has the same nomenclature as a corresponding component previously described (e.g., associated with the ECC decoder 120-2 in FIG. 14) can be assumed to perform in the same manner. As a result, the function of such components will not be repeated. For example, syndrome generator 1410 depicted in FIG. 15 performs in the same manner as the syndrome generator 1410A of FIG. 14. Accordingly, the function of the syndrome generator 1410 will not be repeated in the description of FIG. 15.

After receiving the codeword 1 data 1405 from the memory 103, codeword 1 is received as an input to the syndrome decoder 1410 and SPC data recovery module 1500. The syndrome values are input to ELP generator 1502, where error location polynomials are calculated. Instead of identifying corrupt symbol locations in codeword 1, the ELP generator 1502 identifies polynomials of a potentially corrupt device from among available devices, passing corresponding polynomials to error location generator 1504 and error value generator 1416. An underlying assumption leveraged in the instant application is that failures most likely occur in a single device instead of multiple devices. Thus, the error location generator 1504 will pass location information of the corrupt device (e.g., device-3) to SPC data recovery module 1500 for single parity correction and recovery.

Single parity correction will take all of the data received from the error location generator 1504 and the original codeword 1 data 1405 (e.g., all bits from all devices received during a read). The failed data are recovered by XOR'ing the data for each bit location across all devices except for the failed device. Thus, location information, obtained from the error location generator 1504 to detect errors, is passed to the SPC data recovery module 1500 to correct the error using the described XOR process.

If more than (1) corrupt device is identified during the SPC data recovery, a decoding failure is declared along data path 1506. The remainder of the operation of the ECC decoding system 120-2.1 is similar to the description of the ECC decoding system 120-2 of FIG. 14 and will not be repeated.

Figure 16:
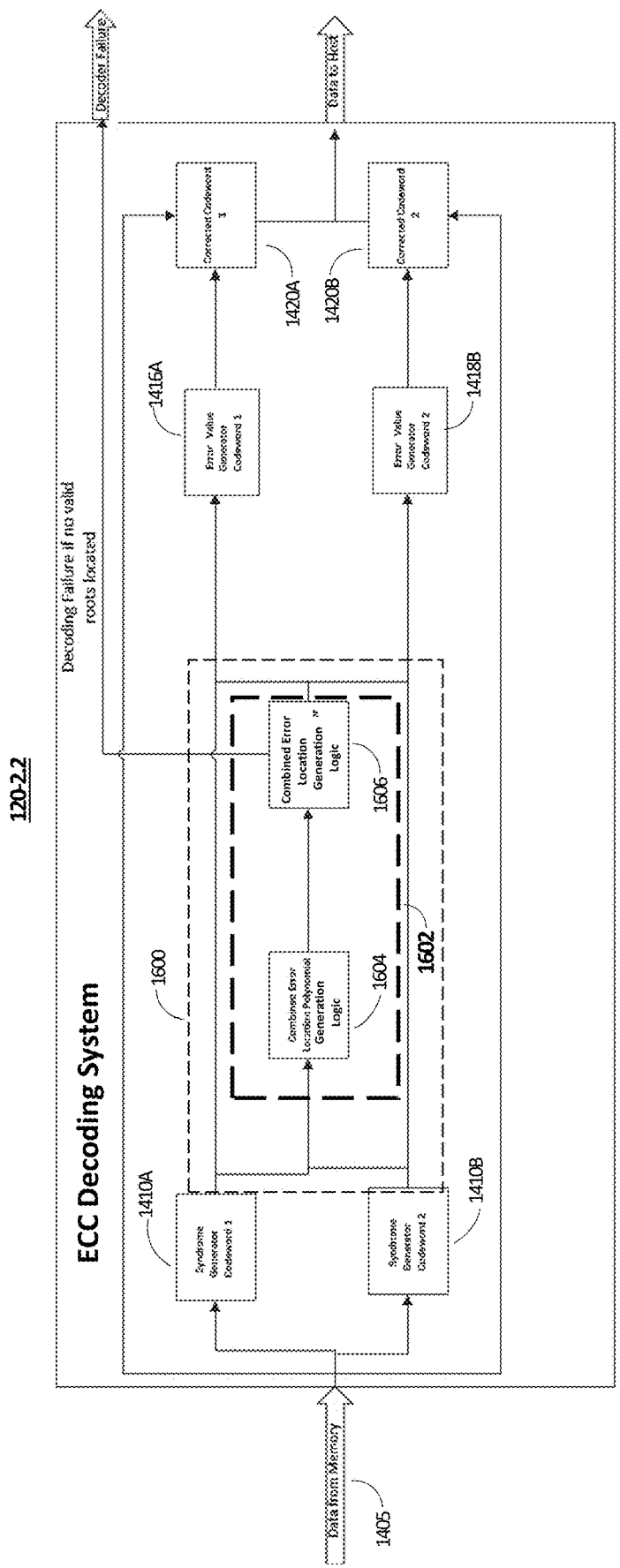
FIG. 16 illustrates another alternative ECC decoding system to the system of FIG. 14 and configured to perform collaborative decoding.

FIG. 16 illustrates an exemplary ECC decoding system 120-2.2 configured to perform IRS collaborative decoder. Several of the internal components of ECC decoding system 120-2.2 were previously described during the discussion of the ECC decoding system 120-2 depicted in FIG. 14. Accordingly, the discussion of these previously described components will not be repeated here. In addition to the previously discussed components, the ECC decoding system 120-2.2 includes a BMA shift register logic 1600 that includes a modified inner loop storage (MILS) logic 1602 for implementing the combined ELP logic 1604 and error location generation logic 1606.

The MILS logic 1602 combines the syndrome information from multiple codewords to create a combined error location polynomial and error location values. The MILS logic 1602 also executes a search of possible error locations as part of determining the combined error location value for application across all codewords, as described in relation to the method 1000 depicted in FIG. 10. The MILS logic 1602 is discussed in greater detail in relation to FIG. 17. Below.

Figure 17:
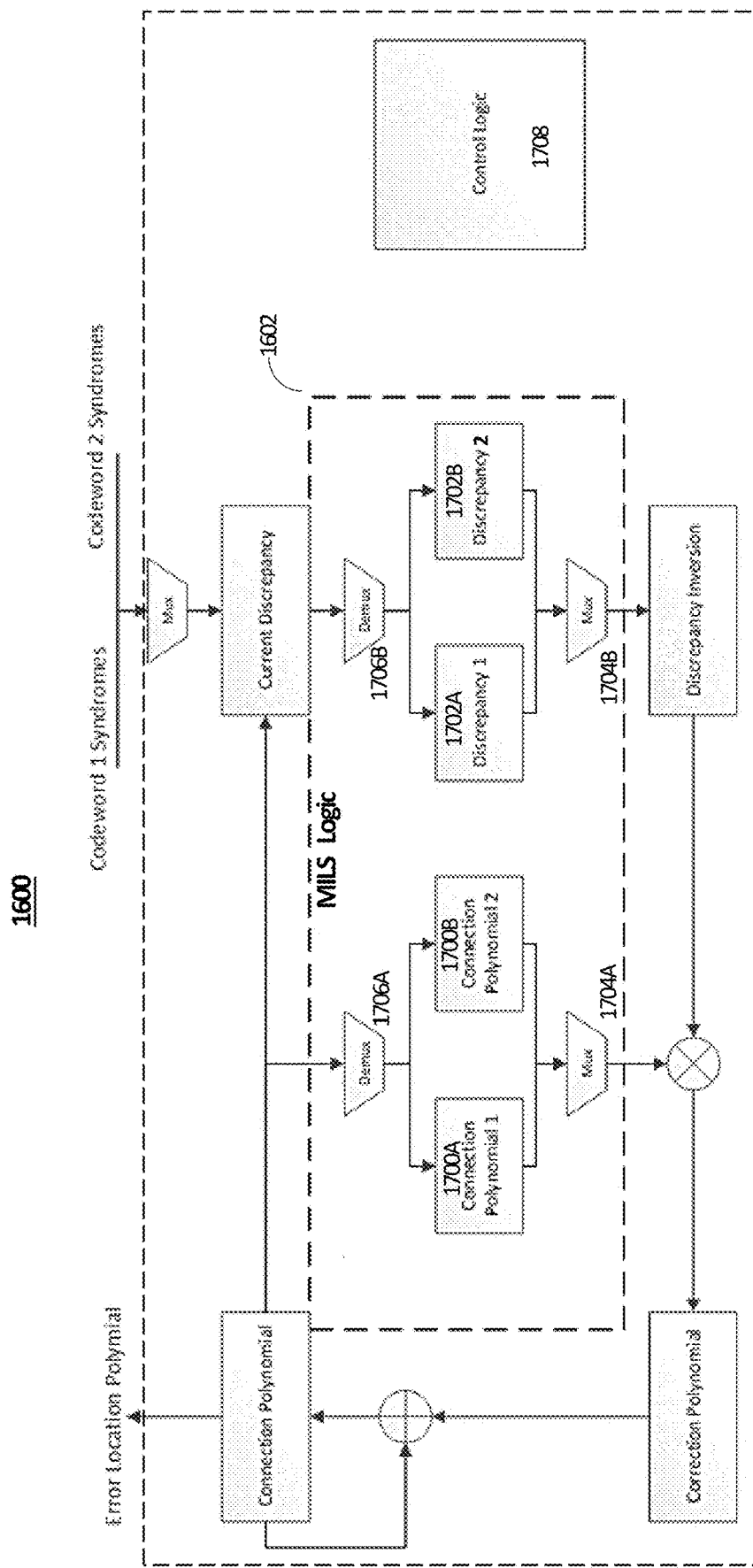
FIG. 17 illustrates an exemplary block diagram of modified inner loop ECC shift register logic.

FIG. 17 illustrates an exemplary block diagram of modified inner loop ECC shift register logic 1602. The MILS logic 1602 represents an inner loop formed within the BMA shift register logic 1600 that enables iterating or ping-ponging across codeword 1 and codeword 2 (the embodiments can include more than two codewords) and provides more storage elements polynomial and discrepancy data. For example, individual connection polynomial storage elements (i.e., shift registers) 1700A/1700B are provided for storage of connection polynomials associated with codeword 1 and codeword 2, respectively. Similarly, individual discrepancy shift registers 1702A/1702B are provided for storage of discrepancy data associated with codeword 1 and codeword 2 respectively.

Multiplexer circuits 1704A/1704B and demultiplexer circuits 1706A/1706B are provided to enable the ping-ponging between the codewords 1 and codeword 2. During operation, connection polynomial shift registers 1700A/1700B and the discrepancy shift registers 1702A/1702B are updated in accordance with the BMA modifications discussed above in relation to FIG. 10. Control logic 1708 facilitates selection between various outputs at any given point in time in accordance with update criteria.

The MILS logic 1602 permits iterating through processes in a manner similar to the conventional BMA shift register logic operation. However, the shift register modifications within the MILS logic 1602 form the inner loop and provide the additional storage elements that hold temporary values between updates for each one of the codewords.

The connection polynomial are values used to perform shift register synthesis operations. For example, the ELPs are essentially constructed iteratively. That is, at each step, a new power to the polynomial is calculated. For example, the construction process begins with a (1) in the appropriate field, then calculate the discrepancies, and adds back a new value. Each update or iteration adds more values into the polynomial that constitutes construction. The resulting ELPs are the output of this part of the process and are used to calculate the roots and perform the Chien search.

The ECC solutions (e.g., single-pass, interleaved, collaborative decoding techniques) described herein can correct up to an entire device failure in a cacheline. They provide Reasonably low decoding UE probability when a single device fails with very low decoding error (SDC) probability. The embodiments include related approaches.

One approach HetIRS uses heterogeneous codewords where one codeword is capable of correcting a single device failure and the other codeword is not. The stronger codeword is corrected first, and the location of the failing device is used as erasure information in the "weaker" codeword to enable correction using an erasure decoder. The second codeword does not need to be an RS code but could be a different code, such as an SPC code.

A second approach, referred to as collaborative decoding efficiently combines information from two (homogenous or heterogenous) RS codewords. This approach uses standard RS decoding concepts but modifies the BMA. This modified BMA approach uses a shift register synthesis scheme that iterates through all (two or more) interleaved codewords when updating the shift register.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus (error location generator), comprising:
   a first set of storage circuits configured for temporarily storing at least first and second connection polynomial data corresponding to first and second codewords, each storage circuit of the first set having (i) an input port coupled to an output port of first divider logic and (ii) an output port coupled to an input port of first combiner logic;
   wherein an output port of the first combiner logic is coupled, at least indirectly, to a first input port of multiplier logic;
   a second set of storage circuits configured for temporarily storing at least first and second discrepancy data corresponding to the first and second codewords, each storage circuit of the second set having (i) an input port coupled to an output port coupled to second divider logic and (ii) an output port coupled to an input port of second combiner logic;
   wherein an output port of the second combiner logic is coupled, at least indirectly, to a second input port of the multiplier logic; and
   control logic configured for (i) updating the stored first and second connection polynomial data and the stored first and second discrepancy data and (ii) selecting between outputs of the first and second combiner logic to provide as an input to the multiplier logic.

2. The apparatus of claim 1, wherein the updating is performed periodically.

3. The apparatus of claim 2, wherein the periodic updating is performed in an iterative fashion between the first set of storage circuits and the second set of storage circuits.

4. The apparatus of claim 1, wherein the first and second storage circuits are formed of corresponding shift registers.

5. The apparatus of claim 4, wherein the first and second divider logic is formed of corresponding demultiplexers.

6. The apparatus of claim 5, wherein the first and second combiner logic is formed of corresponding multiplexers.

7. The apparatus of claim 1, wherein the first and second storge circuits, the first and second divider logic, and the first and second combiner logic form a modified inner loop of a Berlekamp-Massey algorithm (BMA) shift register synthesis.

8. The apparatus of claim 7, wherein the inner loop functions as a combined error location polynomial generator and a combined error location generator.

9. The apparatus of claim 8, wherein the first combiner logic is configured to receive a single connection polynomial as an input thereto.

10. The apparatus of claim 9, wherein the second combiner logic is configured to receive a current discrepancy input, the current discrepancy input being a function (i) at least one of codeword 1 and codeword 2 syndromes and (ii) the single connection polynomial.

11. The apparatus of claim 10, wherein a second divider output is coupled to a discrepancy module input port and an output port of the discrepancy module is coupled directly to the second input port of the multiplier logic.

12. An error location generator, comprising:
   a first set of shift registers configured for temporarily storing first and second connection polynomial data corresponding to first and second codewords, each shift register of the first set having (i) an input port coupled to an output port of a first demultiplexer and (ii) an output port coupled to an input port of a first multiplexer;

wherein an output port of the first multiplexer is coupled, at least indirectly, to a first input port of a multiplier;

a second set of shift registers configured for temporarily storing at least first and second discrepancy data corresponding to the first and second codewords, each shift register of the second set having (i) an input port coupled to an output port coupled to a second demultiplexer and (ii) an output port coupled to an input port of a first multiplexer;

wherein an output port of the second multiplexer is coupled, at least indirectly, to a second input port of the multiplier; and control logic configured for (i) updating the stored first and second connection polynomial data and the stored first and second discrepancy data and (ii) selecting between outputs of the first and second multiplexers to provide an input to the multiplier.

13. The apparatus of claim 12, wherein the updating is performed periodically.

14. The apparatus of claim 12, wherein the first and second shift registers, the first and second demultiplexers, and the first and second multiplexers form a modified inner loop of a Berlekamp-Massey algorithm (BMA) shift register synthesis.

15. The apparatus of claim 14, wherein the inner loop functions as a combined error location polynomial generator and a combined error location generator.

16. The apparatus of claim 15, wherein the first multiplexer is configured to receive a single connection polynomial as an input thereto.

17. The apparatus of claim 16, wherein the second multiplexer is configured to receive a current discrepancy input, the current discrepancy input being a function (i) at least one of codeword 1 and codeword 2 syndromes and (ii) the single connection polynomial.

18. The apparatus of claim 17, wherein a second demultiplexer output is coupled to a discrepancy module input port and an output port of the discrepancy module is coupled directly to the second input port of the multiplier.

19. The apparatus of claim 13, wherein the periodic updating is performed in an iterative fashion between the first set of shift registers and the second set of shift registers.

* * * * *